US012706272B2

(12) United States Patent
Wieland et al.

(10) Patent No.: US 12,706,272 B2
(45) Date of Patent: Aug. 11, 2026

(54) DETECTOR SUBSTRATE FOR USE IN A CHARGED PARTICLE MULTI-BEAM ASSESSMENT TOOL

(71) Applicant: ASML NETHERLANDS B.V., Veldhoven (NL)

(72) Inventors: Marco Jan-Jaco Wieland, Delft (NL); Stoyan Nihtianov, Eindhoven (NL); Roy Ramon Veenstra, Delft (NL); Hui Jiang, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 553 days.

(21) Appl. No.: 18/011,838

(22) PCT Filed: Jul. 5, 2021

(86) PCT No.: PCT/EP2021/068548
§ 371 (c)(1),
(2) Date: Dec. 20, 2022

(87) PCT Pub. No.: WO2022/008462
PCT Pub. Date: Jan. 13, 2022

(65) Prior Publication Data

US 2023/0238211 A1 Jul. 27, 2023

(30) Foreign Application Priority Data

Jul. 6, 2020 (EP) .................................... 20184160
Dec. 23, 2020 (EP) .................................... 20217152

(51) Int. Cl.
*H01J 37/244* (2006.01)
*H01J 37/147* (2006.01)
*H01J 37/317* (2006.01)

(52) U.S. Cl.
CPC ........ *H01J 37/244* (2013.01); *H01J 37/1475* (2013.01); *H01J 37/1477* (2013.01);
(Continued)

(58) Field of Classification Search
CPC .. H01J 37/1475; H01J 37/1477; H01J 37/244; H01J 37/3177; H01J 37/026; H01J 37/0453
See application file for complete search history.

(56) References Cited

U.S. PATENT DOCUMENTS 8,629,395 B2 1/2014 Morishita et al.
11,430,629 B2 8/2022 Wang et al.
(Continued)

FOREIGN PATENT DOCUMENTS

EP 1602121 12/2005
EP 1619495 1/2006
(Continued)

OTHER PUBLICATIONS

Djekic et al., "Temperature-Controlled Transimpedance Amplifier Using a Multi-Element Pseudo-Resistor", IEEE Journal of Solid-State Circuits, vol. 53, No. 7, Jul. 2018 (Year: 2018).*
(Continued)

*Primary Examiner* — David E Smith
(74) *Attorney, Agent, or Firm* — Pillsbury Winthrop Shaw Pittman, LLP

(57) ABSTRACT

A detector substrate (or detector array) for use in a charged particle multi-beam assessment tool to detect charged particles from a sample. The detector substrate defines an array of apertures for beam paths of respective charged particle beams of a multi-beam. The detector substrate includes a sensor unit array. A sensor unit of the sensor unit array is adjacent to a corresponding aperture of the aperture array. The sensor unit is configured to capture charged particles
(Continued)

from the sample. The detector array may include an amplification circuit associated with each sensor unit in the sensor unit array and proximate to the corresponding aperture in the aperture array. The amplification circuit may include a Trans Impedance Amplifier and/or an analogue to digital converter.

20 Claims, 13 Drawing Sheets

(52) U.S. Cl.
CPC ..... *H01J 37/3177* (2013.01); *H01J 2237/026* (2013.01); *H01J 2237/0453* (2013.01)

(56) References Cited

U.S. PATENT DOCUMENTS

| | | | | |
|---|---|---|---|---|
| 11,508,547 | B2 | 11/2022 | Wang et al. | |
| 2003/0189180 | A1 | 10/2003 | Hamaguchi et al. | |
| 2010/0276606 | A1 | 11/2010 | Baars et al. | |
| 2012/0112086 | A1* | 5/2012 | Tsai | G01J 1/4228 250/208.2 |
| 2013/0161511 | A1 | 6/2013 | Karimata et al. | |
| 2014/0110810 | A1* | 4/2014 | Yamamoto | H10F 39/811 257/443 |
| 2016/0064182 | A1* | 3/2016 | Ikeda | H01J 37/222 250/307 |
| 2017/0155398 | A1* | 6/2017 | Narayanan | H03M 1/0609 |
| 2018/0224564 | A1* | 8/2018 | Fu | G01T 1/247 |
| 2019/0259564 | A1 | 8/2019 | Kruit et al. | |
| 2019/0378682 | A1 | 12/2019 | Wang et al. | |
| 2020/0219696 | A1 | 7/2020 | Wang et al. | |
| 2020/0273664 | A1 | 8/2020 | Wang et al. | |

FOREIGN PATENT DOCUMENTS

| | | | | |
|---|---|---|---|---|
| EP | 2425444 | | 3/2012 | |
| EP | 2702595 | | 3/2014 | |
| EP | 2715768 | | 4/2014 | |
| JP | 5386596 | | 1/2014 | |
| JP | 2019/186112 | | 10/2019 | |
| JP | 2019186112 | A * | 10/2019 | |
| JP | 2020534641 | | 11/2020 | |
| JP | 2021526714 | | 10/2021 | |
| WO | 2012/148267 | | 11/2012 | |
| WO | 2019/053173 | | 3/2019 | |
| WO | WO-2019053173 | A1 * | 3/2019 | H10F 39/803 |
| WO | 2022/058253 | | 3/2022 | |

OTHER PUBLICATIONS

Office Action issued in corresponding Japanese Patent Application No. 2022-579910, dated Feb. 14, 2024.
Jingwei Wei et al., "A 63.2μW 11-bit Column Parallel Single-slope ADC with Power Supply Noise Suppression for CMOS Image Sensors", IEEE International Symposium on Circuits and Systems (ISCAS), pp. 1-4 (2020).
International Search Report and Written Opinion issued in the corresponding International Application No. PCT/EP2021/068548 (Oct. 19, 2021).
Pieter Harpe, "A Compact 10-b SAR ADC With Unit-Length Capacitors and a Passive FIR Filter", IEEE Journal of Solid-State Circuits, vol. 54, No. 3, pp. 636-645 (Mar. 3, 2019).
Denis Djekic et al., "A 0.1% THD, 1-MΩ to 1-GΩ Tunable, Temperature-Compensated Transimpedance Amplifier Using a Multi-Element Pseudo-Resistor", IEEE Journal of Solid-State Circuits, vol. 53, No. 7, pp. 1913-1923 (Jul. 2018).
Office Action issued in corresponding Canadian Patent Application No. 3,184,843, dated May 10, 2024.

* cited by examiner

Fig. 1

Fig. 4
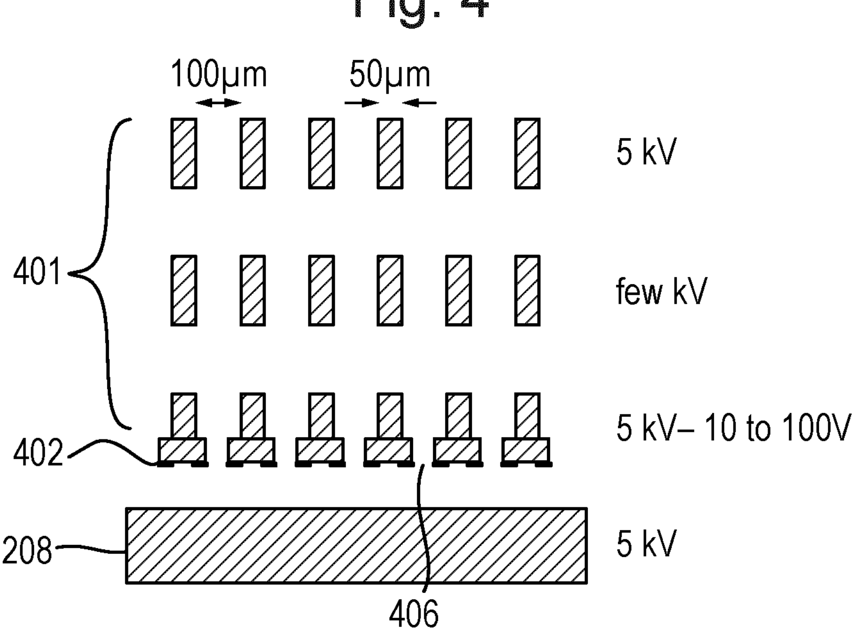
Fig. 5
402
404
405
406
Fig. 6
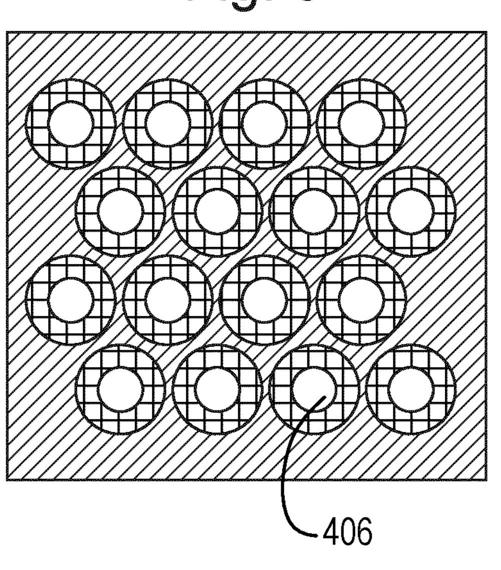
Fig. 7
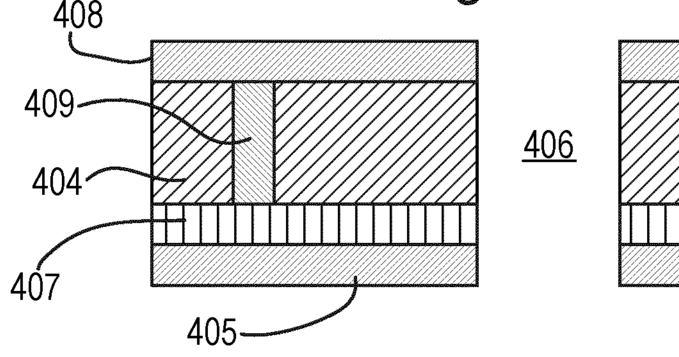
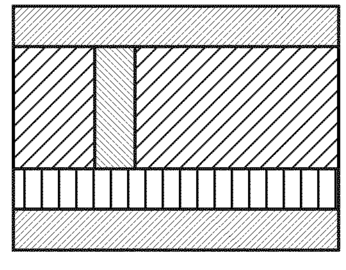

DETECTOR SUBSTRATE FOR USE IN A CHARGED PARTICLE MULTI-BEAM ASSESSMENT TOOL

CROSS-REFERENCE TO RELATED APPLICATIONS

This application is the U.S. national phase entry of PCT patent application no. PCT/EP2021/068548 which was filed on July 5. 2021 which claims priority of European Patent Application No. Ser. No. 20/184,160.8 which was filed on Jul. 6, 2020 and of European Patent Application No. 20217152.6 which was filed on December 23. 2020 and which are each incorporated herein in its entirety by reference.

FIELD

The embodiments provided herein generally relate to a detector substrate, and more particularly, an objective lens assembly, a charged particle beam assessment tool apparatus using more than one beam of charged particles and a method of assessing a sample.

BACKGROUND

When manufacturing semiconductor integrated circuit (IC) chips, undesired pattern may occur on a substrate (e.g. wafer) or a mask during the fabrication processes, thereby reducing the yield. Defects may occur as a consequence of, for example, optical effects and incidental particles or other processing step such as etching, deposition of chemical mechanical polishing. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample or target. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample.

By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample. In such inspection the collected secondary electrons are detected by a detector within the tool. The detector generates a signal in response to the incidental particle. As an area of the sample is inspected, the signals comprise data which is processed to generate the inspection image corresponding to the inspected area of the sample. The image may comprise pixels. Each pixel may correspond to a portion of the inspected area. Typically an electron beam inspection tool has a single beam and may be referred to as a Single Beam SEM. There have been attempts to introduce a multi-electron beam inspection in a tool (or a 'multi-beam tool') which may be referred to as Multi Beam SEM (MBSEM).

There is a general need to improve the detector performance and architecture to enable improvements in throughput and other characteristics of a charged particle inspection apparatus.

SUMMARY

The embodiments provided herein disclose a detector substrate for use in charged particle beam inspection apparatus.

According to a first aspect of the invention, there is provided. a detector substrate (or detector array) for use in a charged particle multi-beam assessment tool to detect charged particles from a sample, the detector substrate defining an array of apertures for the beam paths of respective charged particle beams of a multi-beam, the detector substrate comprising: a sensor unit array, a sensor unit of the sensor unit array adjacent a corresponding aperture of the aperture array and the sensor unit configured to capture charged particles from the sample, wherein the detector array (or detector substrate) comprises an amplification circuit associated with each sensor unit in the sensor unit array and proximate to the corresponding aperture in the aperture array, the amplification circuit comprising a Trans Impedance Amplifier and/or an analogue to digital converter.

According to a second aspect of the invention, there is provided a detector substrate for use in in a charged particle multi-beam assessment tool to detect charged particles from a sample, the detector substrate defining an array of apertures for the beams path of respective charged particle beams of a multi-beam, the detector substrate comprising: a sensor unit of a sensor unit array configured to capture charged particles from the sample, a cell array, the cells of the cell array associated with an aperture of an aperture array for the path of the multibeam and associated with a sensor unit of the sensor unit array; and a wiring route configured to transmit signals, e.g. transcieve from the associated sensor unit between the associated cell to at least a perimeter of the cell array, the wiring route configured to be routed between other cells of the cell array.

According to a third aspect of the invention, there is provided a detector substrate for use in a charged particle multi-beam assessment tool to detect charged particles from a sample, the detector substrate defining an aperture array for respective beam paths of a multibeam, the detector substrate comprising a sensor unit of a sensor unit array configured to capture charged particles from the sample, a cell array, the cells of the cell array each associated with an aperture of the aperture array, and amplification circuitry associated which each cell of the cell array, the amplification circuitry comprising a variable amplifier and an analogue to digital converter.

According to a fourth aspect of the invention, there is provided An objective lens assembly for a multi-beam assessment tool, the objective lens assembly comprising: an objective lens configured to project a plurality of charged particle beams onto a sample, wherein in the objective lens is defined an array of beam apertures for a path of a respective charged particle beams towards the sample; and a detector substrate of any of the first to third aspects of the invention.

According to a fifth aspect of the invention, there is provided a. a method assessing a sample using a multi-beam of charged particles using the detector substrate of the first to third aspects of the invention or the objective lens assembly of the fourth aspect of the invention.

According to a sixth aspect of the invention, there is provided a method of assessing a sample comprising: projecting a multi-beam of charged particles towards a sample; capturing charged particles emitted from the sample in response to the multi-beam of charged particles; transmitting an analogue signal in response to the capture of a charged particle; amplifying the analogue signal using an amplifier; converting the analogue signal into a digital signal using an analogue to digital converter; and controlling the dynamic range of the amplifier and the analogue to digital to converter.

Other advantages of the present invention will become apparent from the following description taken in conjunction with the accompanying drawings wherein are set forth, by way of illustration and example, certain embodiments of the present invention.

BRIEF DESCRIPTION OF FIGURES

The above and other aspects of the present disclosure will become more apparent from the description of exemplary embodiments, taken in conjunction with the accompanying drawings.

FIG. 1 is a schematic diagram illustrating an exemplary charged particle beam inspection apparatus.

FIG. 4 is a schematic cross-sectional view of an objective lens of an inspection apparatus according to an embodiment.

FIG. 5 is a bottom view of the objective lens of FIG. 4.

FIG. 6 is a bottom view of a modification of the objective lens of FIG. 4.

FIG. 7 is an enlarged schematic cross-sectional view of a detector incorporated in the objective lens of FIG. 4.

FIG. 16 is a schematic representation of a sensor unit according to an embodiment.

DETAILED DESCRIPTION

Figure 2:
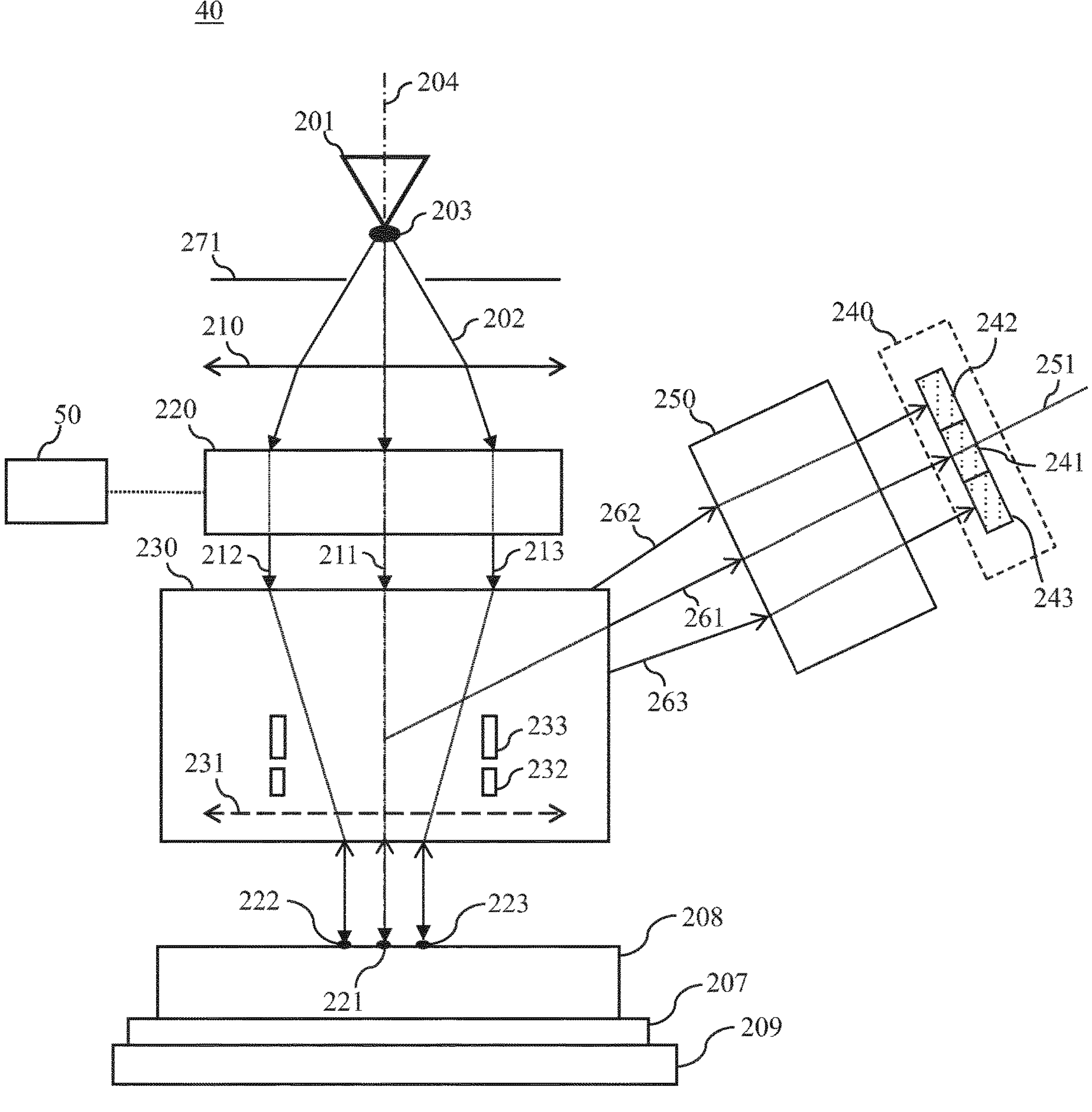
FIG. 2 is a schematic diagram illustrating an exemplary multi-beam apparatus that is part of the exemplary charged particle beam inspection apparatus of FIG. 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises an scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e. a mid-point of the primary electron optical axis, of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations which result in blurry and out-of-focus images of the sample substrate. In particular, for sub-beam paths that are not on the central axis, the aberrations in the sub-beams may increase with the radial displacement from the central axis. Such aberrations may remain associated with the secondary electrons when they are detected. Such aberrations therefore degrade the quality of images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Figure 1:
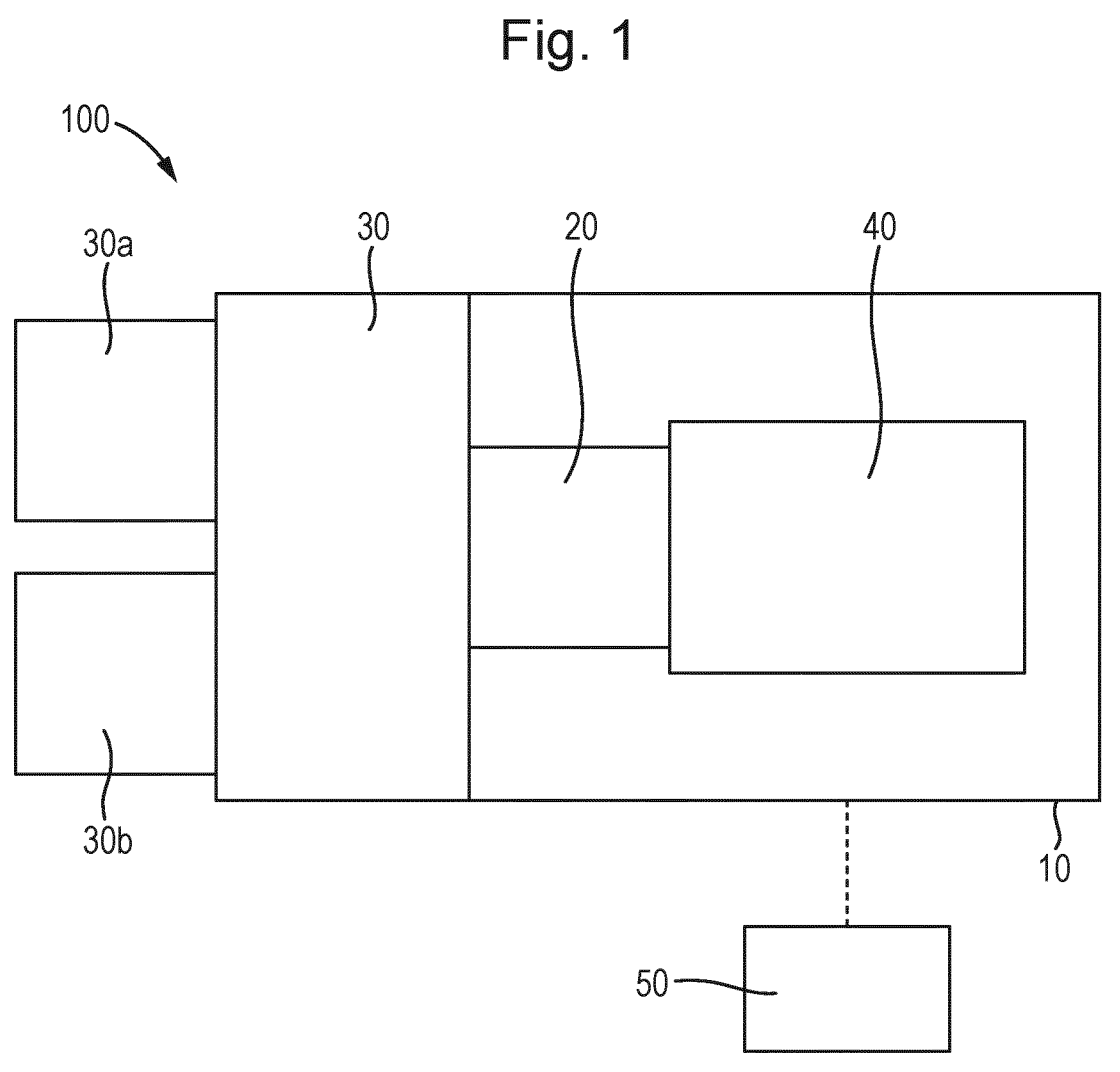

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. Such circuitry may comprise control circuitry. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231, e.g. a unitary lens operating on the whole beam. An objective lens may be the last electron-optical element in the path of the multi-beam or in the electron-optical system; so the objective lens may be referred to as a type of last electron-optical element. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus the multi-beam array interacts with an incident primary beam path to generate a multi-beam path down-beam of the multi-beam array.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also be referred to as a coulomb aperture array.

Condenser lens 210 is configured to focus primary electron beam 202. Condenser lens 210 may be designed to focus primary electron beam 202 to become a parallel beam and be normally incident onto source conversion unit 220. Condenser lens 210 may be a movable condenser lens that may be configured so that the position of its first principle plane is movable. The movable condenser lens may be configured to be magnetic. Condenser lens 210 may be an anti-rotation condenser lens and/or it may be movable.

Source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e. primary sub-beams 211, 212, 213. The image forming array may comprise a plurality electron beam manipulators such as micro-deflectors or micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of condenser lens 210. If the condenser lens is moveable and magnetic, off-axis sub-beams 212 and 213 may result that illuminate source conversion unit 220 with rotation angles. The rotation angles change with the focusing power or the position of the first principal plane of the movable condenser lens. A condenser lens 210 that is an anti-rotation condenser lens may be configured to keep the rotation angles unchanged while the focusing power of condenser lens 210 is changed. Such a condenser lens 210 that is also movable, may cause the rotation angles not change when the focusing power of the condenser lens 210 and the position of its first principal plane are varied.

Objective lens 231 may be configured to focus sub-beams 211, 212, and 213 onto a sample 208 for inspection and may form three probe spots 221, 222, and 223 on the surface of sample 208.

Beam separator 233 may be, for example, a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. The electrostatic force is equal in magnitude but opposite in direction to the magnetic force exerted by magnetic dipole field of beam separator 233 on the individual electrons. Primary sub-beams 211, 212, and 213 may therefore pass at least substantially straight through beam separator 233 with at least substantially zero deflection angles.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons; such electrons may be referred to as signal particles or signal electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be the separate detection elements 241, 242, and 243 that are arranged to detect corresponding secondary electron beams 261, 262, and 263. The detection regions generate corresponding signals which are sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include control circuitry and/or measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
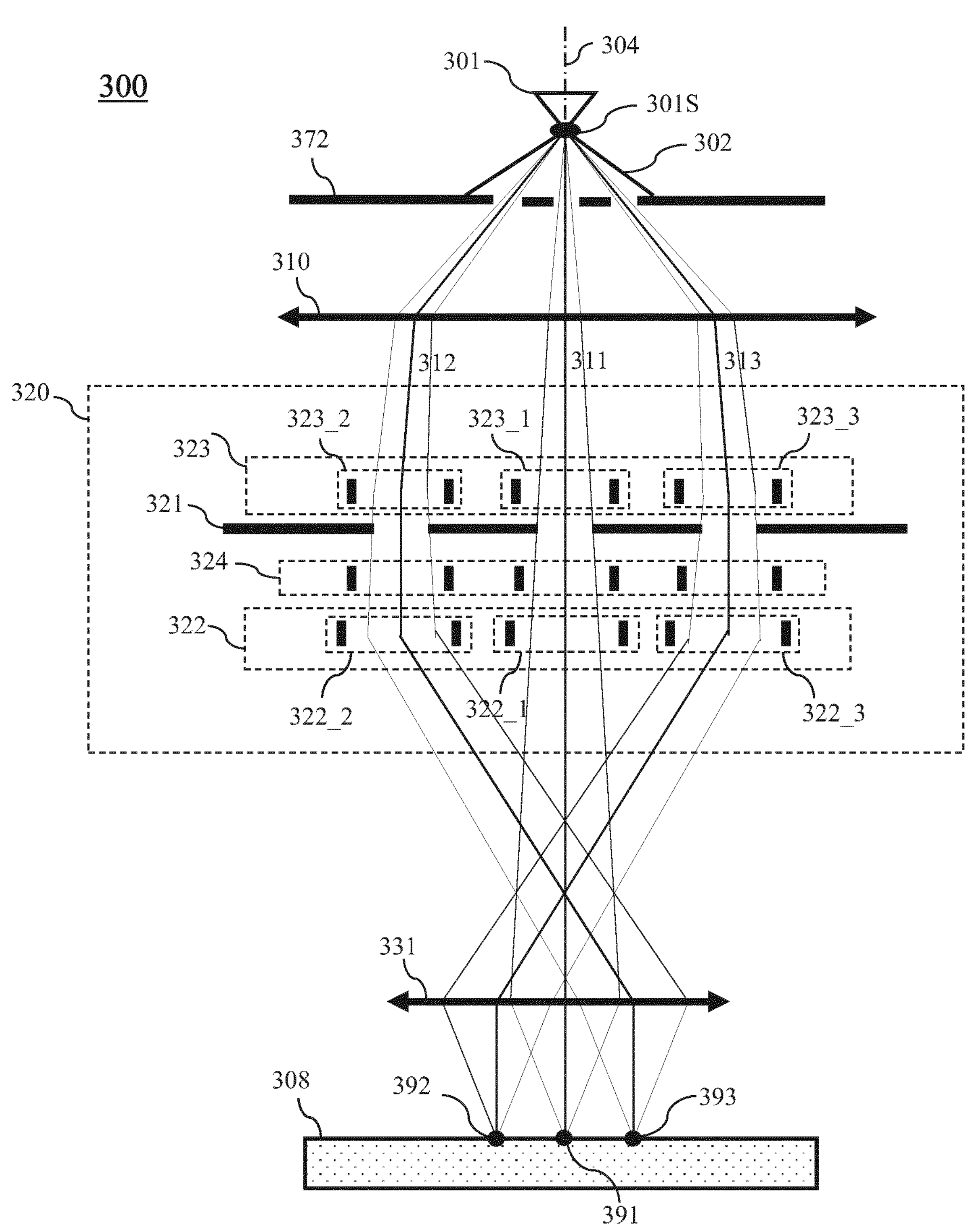
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, a pre-sub-beam-forming aperture array 372, a condenser lens 310 may be the components of an illumination apparatus comprised by the apparatus 300. The source conversion unit 320, an objective lens 331 may the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the pre-sub-beam-forming aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313, by pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a sub-beam-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 3222, and 322_3. There is a respective micro-deflector associated with the path of each sub-beam. The micro-deflectors 322_1, 3222, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312, and 313 to become parallel beams along primary electron-optical axis 304, so that it is perpendicularly incident onto source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In source the conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 3221.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 311 to reduce the off-axis aberrations of three probe spots 391~393. The three deflected sub-beams consequently pass through or approach the front focal point of objective lens 331. As depicted the objective lens 331 is a magnetic lens that focuses all of the sub-beams. In an embodiment of the invention the objective lens is desirably an array of electrostatic lenses which may require the multibeam path to be directed by the source conversion unit 320, specifically for example the image-forming element array 322 featuring micro-deflectors, towards the array of electrostatic lenses in the objective lens 331. (For example each beam could be directed towards its own corresponding micro-lens in the array).

At least some of the above-described components in FIG. 2 and FIG. 3 may individually, or in combination with each other, be referred to as a manipulator array, multi-manipulator array, multi-manipulator or manipulator, because they manipulate one or more beams, or sub-beams, of charged particles.

Existing multi-e-beam defect inspection systems have resolution of about 2 to 10 nm at a throughput of 10 to 6000 $mm^2$ per hour. Such systems have a detector in a secondary column as discussed above. The architecture of existing multi-e-beam inspection tools has a detector remote from the source of electrons emitted from the sample such as back scattered and secondary electrons, which is not scalable for a many-beam system. It is also difficult to integrate a secondary column into a tool with an array objective lens, such as an electrostatic lens, (which is necessary to address coulomb interactions).

In an embodiment the objective lens referred to in earlier embodiments is an array objective lens. Typically such a lens arrangement is electrostatic. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is an Einzel lens. The bottom electrode of objective lens is a CMOS chip detector integrated into a multi-beam manipulator array. Integration of a detector array (e.g. in a detector substrate) into the objective lens removes the need for the secondary projection apparatus 250. The CMOS chip is preferably orientated to face a sample (because of the small distance (e.g. 100 μm) between wafer and bottom of the electron-optical system). In an embodiment, capture electrodes to capture the secondary electron signals are provided. The capture electrodes can be formed in the metal layer of, for example, a CMOS device. The capture electrode may form the bottom layer of the objective lens. The capture electrode may form the bottom surface in a CMOS chip. The CMOS chip may be a CMOS chip detector. The CMOS chip may be integrated into the sample facing surface of an objective lens assembly. The capture electrodes are examples of sensor units for detecting secondary electrons. The capture electrodes can be formed in other layers. Power and control signals of the CMOS may be connected to the CMOS by through-silicon vias. For robustness, preferably the bottom electrode consist of two elements: the CMOS chip and a passive Si plate with holes. The plate shields the CMOS from high E-fields.

Sensor units associated with bottom or sample facing surface of an objective lens are beneficial because the secondary and/or back-scatted electrons may be detected before the electrons encounter and become manipulated by an electron optical element of the electron-optical system. Beneficially the time taken for detection of such a sample emanating electron may be reduced preferably minimized.

In order to maximize the detection efficiency it is desirable to make the electrode surface as large as possible, so that substantially all the area of the array objective lens (excepting the apertures) is occupied by electrodes. Each electrode may have a diameter substantially equal to the array pitch. The electrode surfaces may be formed on the sample-facing surface of the array objective lens. The electrode surfaces may substantially fill the sample-facing surface of the array objective lens. In an embodiment the outer shape of the electrode is a circle, but this can be made a square to maximize the detection area. Also the diameter of the through-substrate hole can be minimized. Typical size of the electron beam is in the order of 5 to 15 micron.

In an embodiment, a single capture electrode surrounds each aperture. The plurality of capture electrodes may be adjacent respective ones of the beam apertures and configured to capture charged particles emitted from the sample. The single capture electrode may have a circular perimeter and/or an outer diameter. The capture electrode may have an area extending between the aperture and the perimeter of the capture electrode. As depicted in FIGS. 5 and 6 the capture electrodes 405 may be arranged in rectangular array or a hexagonal array.

In another embodiment, the capture electrode may be a plurality of electrode elements. The plurality of electrode elements is provided around each aperture. The plurality of electrode elements may, together, have a circular perimeter and/or a diameter. The plurality of electrode elements may, together, have an area extending between the aperture and the perimeter of the plurality of electrode elements. The pluralities of electrode elements 405 may be arranged in rectangular array or a hexagonal array. The electrode elements are examples of sensor elements. The electrons captured by the electrode elements surrounding one aperture may be combined into a single signal or used to generate independent signals. The electrode elements may be divided radially. The electrode elements may form a plurality of concentric annuluses or rings. The electrode elements may be divided angularly. The electrode elements may to form a plurality of sector-like pieces or segments. The segments may be of similar angular size and/or similar area. The electrode elements may be divided both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by electrode is amplified. The purpose of the amplifier is to enable sufficiently sensitive measurement of the current received or collected by the sensor unit to be measured and thus the number of back-scattered and/or secondary electrons. This can be measured by current measurements or the potential difference over a resistor.

Several types of amplifier design may be used to amplify back-scattered and/or secondary electron current collected by electrode for example a Trans Impedance Amplifier. In such a Trans-Impedance Amplifier, the voltage output of the TIA is equal to the TIA resistance ($R_{TIA}$) multiplied by the measured current.

The larger $R_{TIA}$, the higher the amplification. However the bandwidth is determined by the RC time, which is equal to $R_{TIA}$ multiplied by the sum of the capacitances on the entrance side of the TIA.

A finite RC time has a similar effect as a larger electron optics spotsize, so it gives effectively a blur contribution in the deflection direction. Given the blur contribution budget of the detector and the deflection velocity the allowed RC time is determined. Given this RC time and the entrance capacitances $R_{TIA}$ is determined.

Based on the back-scattered and/or secondary electron current and $R_{TIA}$ the signal voltage is determined.

Noise contributions of the detector should be compared to the shot noise of the back-scattered and/or secondary electron current. Taking only the shot noise of the primary electron beam into account, the current noise per sqrt (Hz) due to shot noise is significantly larger than the voltage noise of a state of the art CMOS amplifier of typically ~1 nV/sqrt (Hz) as demonstrated below. The rough calculations set out below demonstrate that the proposed electrode is feasible from a noise point of view.

$$N_{PE\_def} = 5000 \quad (1)$$

$$I_{beam} = 1 \text{ nA} \quad (2)$$

$$d_{def} = 4 \text{ nm} \quad (3)$$

$$N_{pix\_defect} = 4 \quad (4)$$

$$blur_{rc} = 0.5 \text{ nm} \quad (5)$$

$$C_{detector} = \varepsilon_0 \cdot \zeta \cdot \frac{0.25 \cdot \pi \cdot (100\ \mu\text{m})^2}{1\ \mu\text{m}} = 2.086 \times 10^{-13} F \quad (6)$$

$$I_{sn\_noise} = \sqrt{2 \cdot Q_e \cdot I_{beam}} = 1.79 \times 10^{-14} \frac{A}{\sqrt{\text{Hz}}} \quad (7)$$

$$t_{defect} = \frac{N_{PE\_def} \cdot Q_e}{I_{beam}} = 0.801\ \mu s \quad (8)$$

$$1_{scan\_defect} := d_{def} \sqrt{N_{pix_{defect}}} = 8 \text{ nm} \quad (9)$$

-continued $$v_{scan} = \frac{1_{scan\_defect}}{t_{defect}} = 9.986\ \frac{\text{mm}}{\text{s}} \tag{10}$$

$$t_{RC} = \frac{blur_{RC}}{v_{scan}} = 50.069\ \text{ns} \tag{11}$$

$$R_{detector} = \frac{t_{RC}}{C_{detector}} = 2.4x10^5\Omega \tag{12}$$

$$V_{sn} = I_{sn\_noise}R_{detector} = 4.296\frac{nV}{\sqrt{\text{Hz}}} \tag{13}$$

$$V_{sn} = \frac{\sqrt{2}\,Q_2^{3/2}}{\sqrt{J_{beam}}}\frac{blur_{RC}N_{PE\_def}}{C_{detector}d_{def}\sqrt{N_{pix\_defect}}} = 4.296\frac{nV}{\sqrt{\text{Hz}}} \tag{14}$$

The above calculations can be explained as follows. It is assumed that the number of primary electrons required to detected a defect is 5000 (equation 1), the beam current is 1 nA (equation 2) the diameter of a defect is 4 nm (equation 3) and the number of pixels per defect is 4 (equation 4). We assume that a blur due to the finite RC time of the amplifier of 0.5 nm is acceptable (equation 5). The capacitance of the detector can be calculated from the geometry of the arrangement, for example, as indicated in equation 6 where 3 is the dielectric constant of the insulator underlying the capture electrode, 100 μm is the diameter of the capture electrode and 1 μm is the thickness of the insulator underneath the capture electrode. The intrinsic shot noise is calculated as in equation 7. The time to image one defect is calculated as in equation 8 where $Q_c$ is the electron charge. The length of a scan to detect a defect is calculated in equation 9 and the scanning velocity is calculated in equation 10. The RC time to be achieved is calculated in equation 11 and therefore the resistance of the detector is calculated in equation 12 and the resulting voltage noise in equation 13. Equation 14 combines the previous equations into a single equation to show dependencies. The typical voltage noise level that can be achieved in CMOS amplifiers is in the order of 1 nV/sqrt (Hz)—which this typical noise level of a CMOS amplifier. So it is plausible that the noise is dominated by the fundamental shot noise, and not by the voltage noise added by the CMOS amplifier. Because of this it is plausible that the proposed electrode is feasible from a noise point of view. That is a typical CMOS amplifier noise is sufficiently good to have a noise level that is small relative to the shot noise. (Even if it is large relative the shot noise, the arrangement could still work, but the effectiveness in terms of bandwidth or throughput (i.e. speed) could be reduced).

Figure 8:
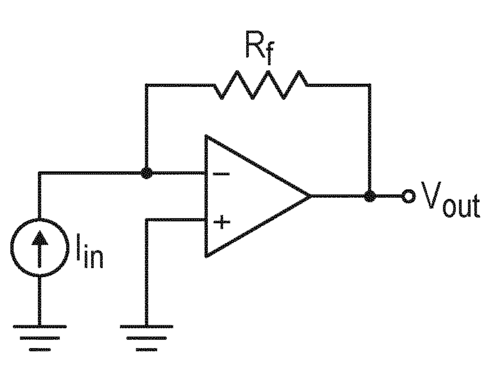
FIG. 8 is a schematic diagram of a theoretical trans impedance amplifier.
Figure 9:
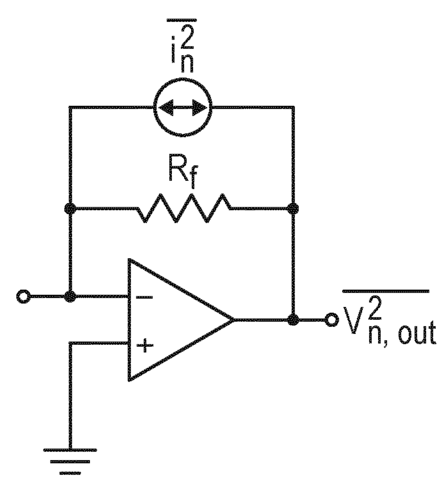
FIG. 9 is a schematic diagram of a trans impedance amplifier indicating the effect of thermal noise.

FIG. 8 is a schematic diagram of a theoretical trans impedance amplifier (TIA) in which the voltage output $V_{out}$ is simply the product of the measured current and the feedback resistance $R_f$. However, a real TIA has noise, in particular shot noise in the input $i_{sn}$ and thermal noise in the feedback resistor $i_n$ as depicted in FIG. 9. In most cases thermal noise dominates. The voltage noise at the output $v_n$ is given by:

$$v_n = \sqrt{4 \cdot k_b \cdot T \cdot R_f} \tag{15}$$

where $k_b$ is the Boltzmann constant. The current noise at the entrance to the TIA is therefore:

$$i_n = \sqrt{\frac{4 \cdot k_b \cdot T}{R_f}} \tag{16}$$

whereas the shot noise is given by:

$$i_{sn} = \sqrt{2 \cdot Q_e \cdot I_{in}} \tag{17}$$

Therefore if the feedback resistance is increased, the thermal noise becomes lower relative to the shot noise of the input current (i.e. the back-scattered and/or secondary electron current).

It can be shown that the invention remains practical taking account of the effect of shot noise, by assuming that the number of electrons required to detect each defect is increased to 10,000; a blur budget of 2 nm is set; and the electrode diameter is reduced to 50 μm. In that case, the capacitance of the electrode becomes about 0.011 pF requiring a resistance of about $3.6\times10^7\Omega$, resulting in a level of thermal noise about 20% greater than the shot noise. Therefore, various different arrangements of the proposed detector are feasible. The capacitance of the electrode can also be controlled by varying the thickness of an adjacent dielectric layer, which may be in the range of about 1 to about 5 μm.

An exemplary embodiment is shown in FIG. 4 which illustrates a multibeam objective lens 401 in schematic cross section. On the output side of the objective lens 401, the side facing the sample 208, a detector module 402 is provided. FIG. 5 is a bottom view of detector module 402 which comprises a substrate 404 on which are provided a plurality of capture electrodes 405 each surrounding a beam aperture 406. Beam apertures 406 are large enough not to block any of the primary electron beams. Capture electrodes 405 can be considered as examples of sensor units which receive back-scattered or secondary electrodes and generate a detection signal, in this case an electric current. The beam apertures 406 may be formed by etching through substrate 404. In the arrangement shown in FIG. 5, the beam apertures 406 are shown in a rectangular array. The beam apertures 406 can also be differently arranged, e.g. in a hexagonal close packed array as depicted in FIG. 6.

FIG. 7 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In an embodiment, there is one amplifier and one analogue to digital converter per capture electrode 405. Logic layer 407 and capture electrodes 405 can be manufactured using a CMOS process with the capture electrodes 405 forming the final metallisation layer.

A wiring layer 408 may be provided on the backside of substrate 404 (i.e. on the opposite side of the capture electrodes, e.g. detector side) or on the detector side around the capture electrodes or within the substrate, for example in layers between two substrates. Reference to the wiring layer on the backside or detector side may include within a number of layers, for example under one or more layers. The wiring layer may be connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is space for all necessary connections. The detection module 402 can also be fabricated using bipolar or other manufacturing techniques. A printed circuit board and/or other semiconductor chips may be provided on the backside of detector module 402. Although reference is made to capture electrodes 405, the electron detection device 240 may comprise sensor units for example the capture electrodes 402

The wiring layer 408 and/or the logic layer 407 may comprise control circuitry formed in the substrate. The control circuitry may comprise one or more of: an amplifier, e.g. a trans-impedance amplifier; an analog-to-digital converter; a data multiplexor; and read-out gates. The control circuitry comprises one amplifier for each sensor unit, e.g. capture electrode. The wiring layer and/or the logic layer may further comprise conductive traces provided on the other side of the substrate to the sensor units, e.g. capture electrodes, for example in the wiring layer. In an embodiment the conductive traces, for example in the wiring layer, may be additionally or alternatively within the substrate. The substrate may further comprise vias passing though the substrate. The substrate may be formed of silicon. The sensor units, e.g. capture electrodes, are formed by a CMOS process.

FIG. 4 depicts a three electrode objective lens but it will be appreciated that any other form of objective lens, e.g. a two electrode lens, may also be used.

Figure 10:
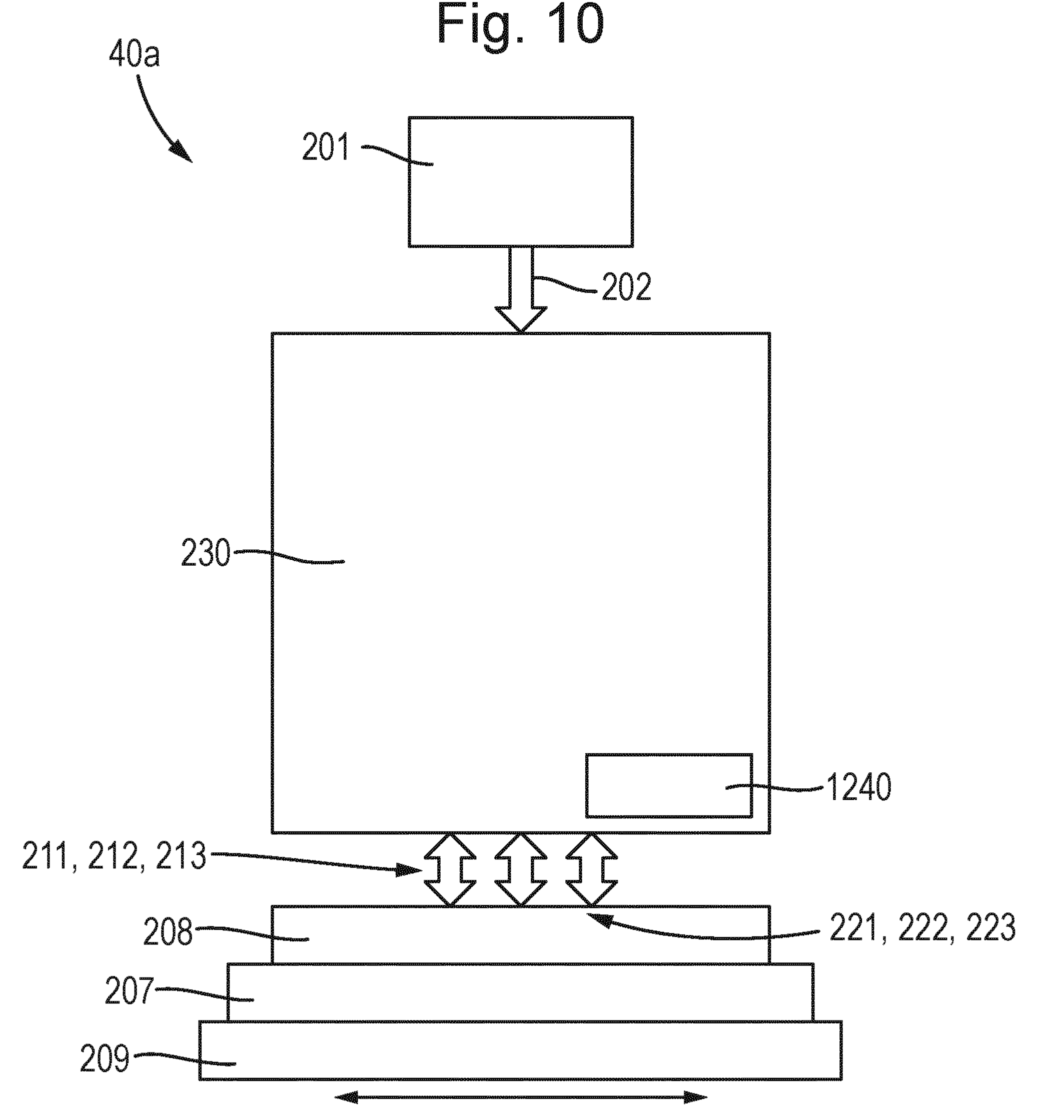
FIG. 10 is a schematic diagram illustrating another exemplary multi-beam apparatus that may be part of the exemplary charged particle beam inspection apparatus of FIG. 1.

Reference is now made to FIG. 10, which is a schematic diagram illustrating another exemplary electron beam tool 40*a* that may be part of the exemplary charged particle beam inspection apparatus 100 of FIG. 1 in place of the tool 40 of FIG. 2. Parts of the apparatus 40*a* that have similar functions as corresponding parts of the apparatus 40 of FIG. 2 are identified with the same references. A reduced or simplified description of such parts is included below in some cases.

Multi-beam electron beam tool 40*a* (also referred to herein as apparatus 40*a*) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam tool 40*a* further comprises an electron detection device 1240. (Note this may be different in structure from the electron detection device 240 in the secondary electron-optical column of the embodiments referred in reference with FIGS. 2 and 3, although it has the same function: to detect electrons from the sample).

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beamlets.

Controller 50 of FIG. 1 may be connected to various parts of electron beam tool 40*a* such as electron source 201, electron detection device 1240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy ≤50 eV and backscattered electrons typically have electron energy between 50 eV and the landing energy of primary sub-beams 211, 212, and 213.

Electron detection device 1240 is configured to detect secondary electrons and/or backscattered electrons and to generate corresponding signals which are sent to a controller or a signal processing system (not shown), e.g. to construct images of the corresponding scanned areas of sample 208. Electron detection device 1240 may comprise a detector module 402 integrated with an objective lens 401 as described above with reference to FIGS. 4 to 7.

Figure 11:
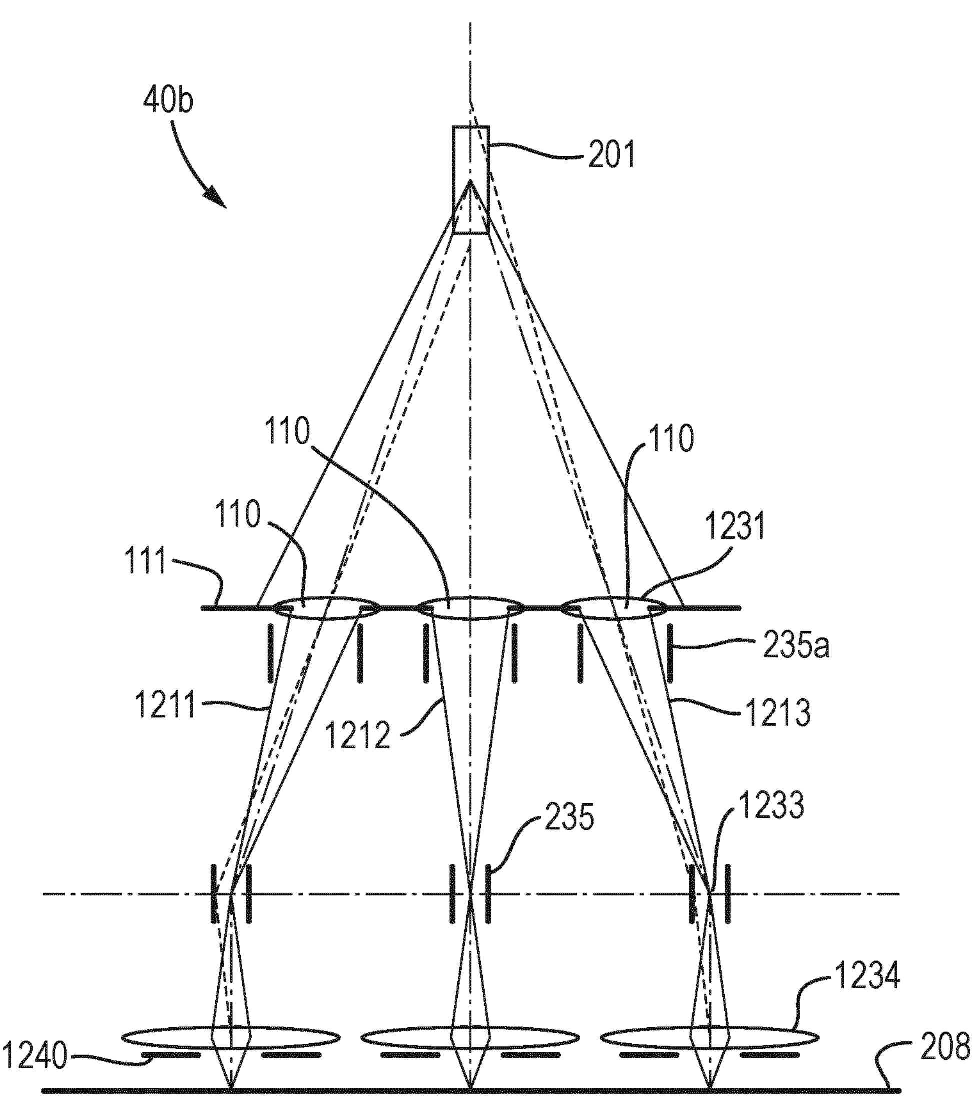
FIG. 11 is a schematic diagram illustrating another exemplary multi-beam apparatus according to an embodiment.

FIG. 11 is a schematic diagram illustrating another exemplary electron beam tool 40*b* that may be part of the exemplary charged particle beam inspection apparatus 100 of FIG. 1 in place of the tool 40 of FIG. 2. Parts of the apparatus 40*a* that have similar functions as corresponding parts of the apparatus 40 of FIG. 2 are identified with the same references. A reduced or simplified description of such parts is included below in some cases.

Electron source 201 directs electrons toward an array of condenser lenses 1231 forming part of projection system 230. The electron source is desirably a high brightness thermal field emitter with a good compromise between brightness and total emission current. There may be many tens, many hundreds or many thousands of condenser lenses 1231. Condenser lenses 1231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses is formed of three plate arrays in which charged particles have the same energy as they enter and leave each lens, which arrangement may be referred to as an Einzel lens. The beam energy is the same on entering as leaving the Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

The array of condenser lenses may comprise a plurality of beam apertures 110. The beam apertures 110 may be formed, for example, by openings in a substantially planar beam aperture body 111. The beam apertures 110 divide a beam of charged particles from source 201 into a corresponding plurality of sub-beams. Each condenser lens in the array directs electrons into a respective sub-beam 1211, 1212, 1213 which is focused at a respective intermediate focus 1233. At the intermediate focuses 1233 are deflectors 235. Deflectors 235 are configured to bend a respective sub-beam 1211, 1212, 1213 by an amount effective to ensure that the principal ray (which may also be referred to as the beam axis) is incident on the sample 208 substantially normally (i.e. at substantially 90° to the nominal surface of the sample). Deflectors 235 may also be referred to as collimators. Downbeam (i.e. closer to the sample) of the intermediate focuses 1233 are a plurality of objective lenses 1234, each of which directs a respective sub-beam 1211, 1212, 1213 onto the sample 208. Objective lenses 1234 can be configured to demagnify the electron beam by a factor greater than 10, desirably in the range of 50 to 100 or more.

An electron detection device 1240 is provided between the objective lenses 1234 and the sample 208 to detect signal particles, e.g. secondary and/or backscattered electrons, emitted from the sample 208. Electron detection device 1240 may comprise a detector module 402 integrated with an objective lens 401 as described above with reference to FIGS. 4 to 7. The electron detection device 1240 may comprise sensor units for example capture electrodes 402.

The system of FIG. 11 can be configured to control the landing energy of the electrons on the sample. The landing energy can be selected to increase emission and detection of secondary electrons dependent on the nature of the sample being assessed. A controller provided to control the objective lenses 1234 may be configured to control the landing energy to any desired value within a predetermined range or to a desired one of a plurality of predetermined values. In an embodiment, the landing energy can be controlled to desired value in the range of from 1000 eV to 5000 eV. Details of electrode structures and potentials that can be used to control landing energy are disclosed in EPA 20158804.3, which document is incorporated herein by reference.

In some embodiments, the charged particle assessment tool further comprises one or more aberration correctors that reduce one or more aberrations in the sub-beams. In an embodiment, each of at least a subset of the aberration correctors is positioned in, or directly adjacent to, a respective one of the intermediate foci (e.g. in or adjacent to the intermediate image plane). The sub-beams have a smallest sectional area in or near a focal plane such as the intermediate plane. This provides more space for aberration correctors than is available elsewhere, i.e. upbeam (closer to the source) or downbeam (closer to the sample) of the intermediate plane (or than would be available in alternative arrangements that do not have an intermediate image plane).

In an embodiment, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 1231 (e.g. with each such aberration corrector being integrated with, or directly adjacent to, one or more of the condenser lenses 1231). This is desirable because at or near the condenser lenses 1231 aberrations will not yet have led to a shift of corresponding sub-beams because the condenser lenses 1231 are vertically close or coincident with the beam apertures. A challenge with positioning correctors at or near the condenser lenses 231, however, is that the sub-beams each have relatively large sectional areas and relatively small pitch at this location, relative to locations further downbeam.

In some embodiments, each of at least a subset of the aberration correctors is integrated with, or directly adjacent to, one or more of the objective lenses 1234. In an embodiment, these aberration correctors reduce one or more of the following: field curvature; focus error; and astigmatism. Additionally or alternatively, one or more scanning deflectors (not shown) may be integrated with, or directly adjacent to, one or more of the objective lenses 1234 for scanning the sub-beams 1211, 1212, 1213 over the sample 208. In an embodiment, the scanning deflectors described in US 2010/0276606, which document is hereby incorporated by reference in its entirety, may be used.

The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In an embodiment the objective lens referred to in earlier embodiments is an array objective lens. Each element in the array is a micro-lens operating a different beam or group of beams in the multi-beam. An electrostatic array objective lens has at least two plates each with a plurality of holes or apertures. The position of each hole in a plate corresponds to the position of a corresponding hole in the other plate. The corresponding holes operate in use on the same beam or group of beams in the multi-beam. A suitable example of a type of lens for each element in the array is a two electrode decelerating lens.

An electron detection device 1240 is provided between the objective lenses 1234 and the sample 208 to detect signal particles, e.g. secondary and/or backscattered electrons, emitted from the sample 208. Electron detection device may comprise a detector module 402 integrated with an objective lens 401 as described above with reference to FIGS. 4 to 7. The electron detection device 240 may comprise sensor units for example capture electrodes 405.

In an embodiment of the invention, the correctors 235 at the intermediate focuses 1233 are embodied by a slit deflector 300. Slit deflector 300 is an example of a manipulator and may also be referred to as a slit corrector.

Figure 12:
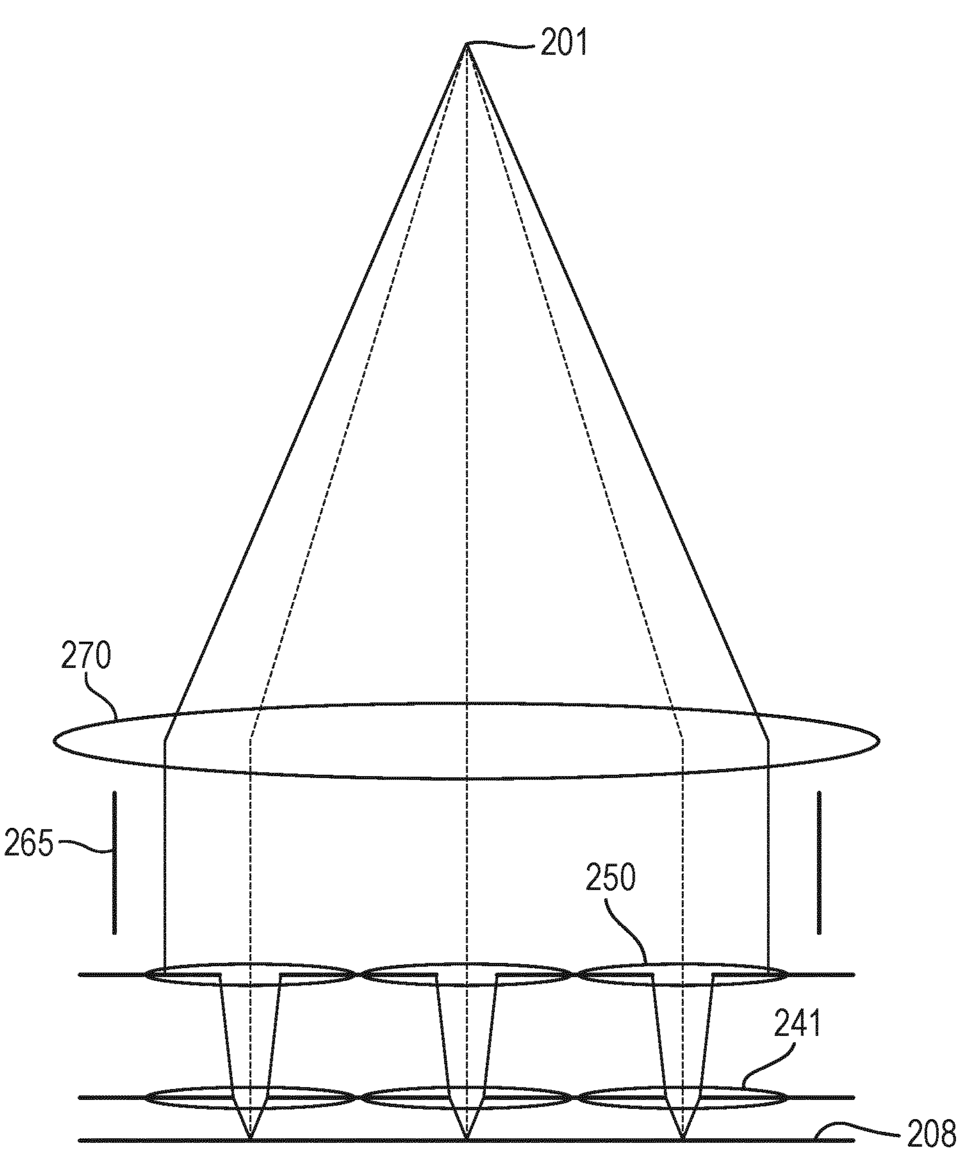
FIG. 12 is a schematic diagram of exemplary multi-beam apparatus according to an embodiment.

Another exemplary electron beam tool 40*c*, that may be part of the exemplary charged particle beam inspection apparatus 100 of FIG. 1 in place of the tool 40 of FIG. 2, is illustrated schematically in FIG. 12. Parts of the apparatus 40*a* that have similar functions as corresponding parts of the apparatus 40 of FIG. 2 are identified with the same references. A reduced or simplified description of such parts is included below in some cases.

In the embodiment of FIG. 12, the electron-optical system comprises a source 201. The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In another arrangement (not shown), the macro-collimator may be partially or wholly replaced by a collimator element array is provided down-beam of the upper beam limiter. Each collimator element collimates a respective sub-beam. The collimator element array may be formed using MEMS manufacturing techniques so as to be spatially compact. The collimator element array may be the first deflecting or focusing electron-optical array element in the beam path down-beam of the source 201. The collimator element array may be up beam of a control lens array 250. The collimator element array may be in the same module as the control lens array 250.

The control lens array 250 may comprise three plate electrode arrays connected to respective potential sources. A function of the control lens array 250 is optimize the beam opening angle with respect to the demagnification of the beam and/or to control the beam energy delivered to the objective lenses 234, each of which directs a respective sub-beam 211, 212, 213 onto the sample 208. Note: in an embodiment the arrangement shown in FIG. 11 may feature a control lens array up-beam of the objective lens array. With respect to the design and function of the control lens array, European Patent Application No. 20196716.3 filed on 17 Sep. 2020 is hereby incorporated by reference.

In the embodiment of FIG. 12 a macro scan deflector 265 is provided to cause sub-beams to be scanned over the sample 208. The macro scan deflector 265 deflects respective portions of the beam to cause the sub-beams to be scanned over the sample 208. In an embodiment, the macro scan deflector 265 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the embodiment shown, the macro scan deflector 265 is provided between the macro collimator 270 and the control lens array 250.

In another arrangement (not shown), the macro scan deflector may be partially or wholly replaced by a scan deflector array. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). The scan deflector array may be up beam of an objective lens array 241. The scan deflector array may be down beam of a control lens array 250. Although reference is made to a single sub-beam associated with a scan deflector, groups of sub-beams may be associated with a scan deflector. In an embodiment, the scanning deflectors described in EP2425444, which document is hereby incorporated by reference in its entirety specifically in relation to scan deflectors, may be used to implement the scan-deflector array. A scan-deflector array (e.g. formed using MEMS manufacturing techniques as mentioned above) may be more spatially compact than a macro scan deflector. The scan deflector array may be in the same module as the objective lens array 241.

In other embodiments both a macro scan deflector 265 and the scan-deflector array are provided. In such an arrangement, the scanning of the sub-beams over the sample surface may be achieved by controlling the macro scan deflector and the scan-deflector array 260 together, preferably in synchronization The objective lens array assembly may further comprise a collimator array and/or a scan deflector array.

Any of the objective lens array assemblies described herein may further comprise a detector array 240. The detector array 240 detects charged particles emitted from the sample 208. The detected charged particles may include any of the charged particles detected by an SEM, including signal particles, e.g. secondary and/or backscattered electrons, emitted from the sample 208.

Figure 13:
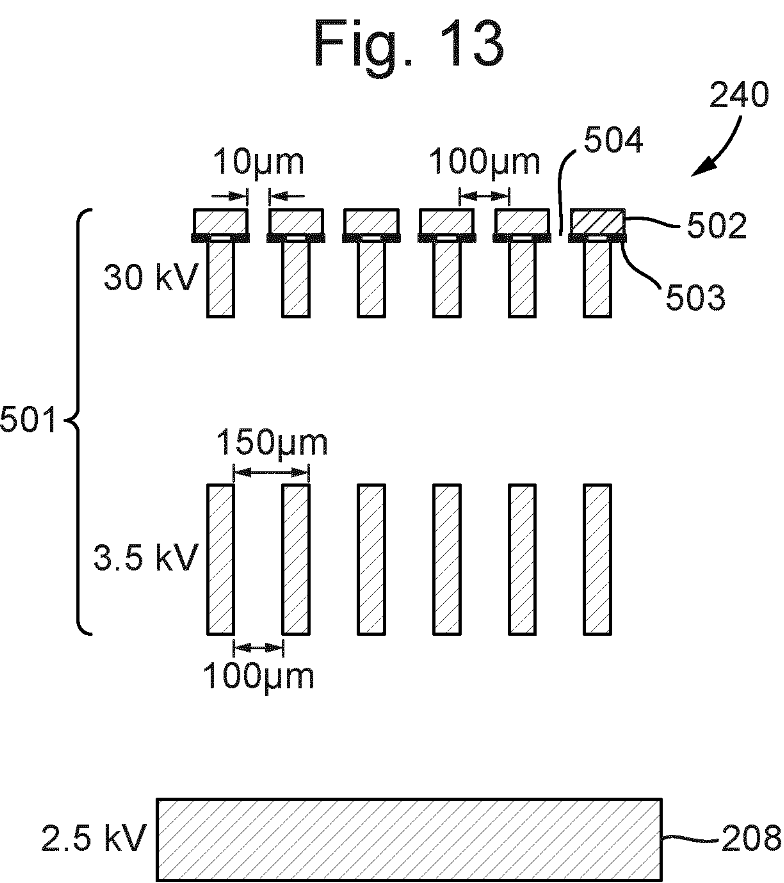
FIG. 13 is a schematic cross-sectional view of an objective lens of an inspection apparatus according to an embodiment.
Figure 14:
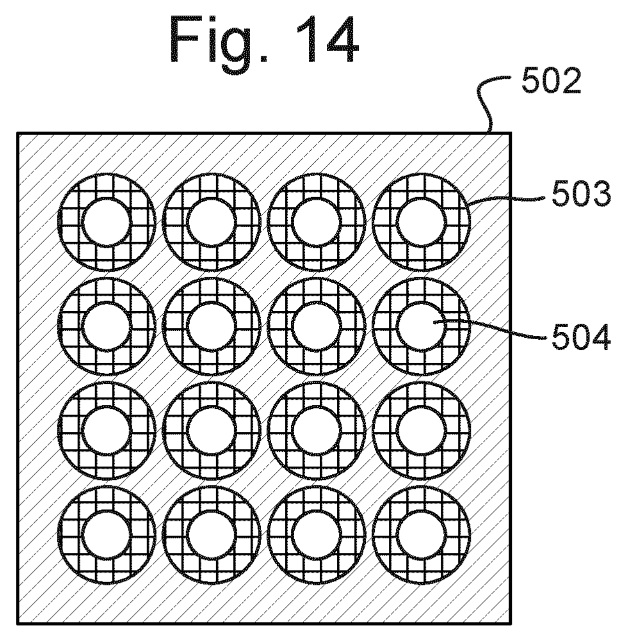
FIG. 14 is a bottom view of a detector unit incorporated in the objective lens of FIG. 13.

FIGS. 13 and 14 depict another example of an electron detection device 240 that can be used in an embodiment of the invention, for example it can be incorporated in the electron beam tools 40, 40*a*, 40*b*, 40*c* described above with reference for example to FIGS. 2, 10, 11 and 12. FIG. 13 is a schematic side view of electron detection device 240 integrated in or associated with the objective lens array 501 and FIG. 14 is a view from below of electron detection device 240.

As shown in FIG. 13, electron detection device 240 in this example comprises a substrate 502 provided with a plurality of sensor units 503 surrounding respective beam apertures 504. Substrate 502 is mounted to the upper electrode (further from sample 208) of a decelerating array objective lens 501. The sensor units 503 face toward the sample 208. The sensor units may be positioned with the sensing surfaces located between the upbeam and downbeam facing surfaces of the upper electrode. The sensor units 503 may be integrated into or associated with the electrode of the objective lens 501 furthest from the sample 208. This is in contrast to the electron detection device 240 of FIG. 7 which is integrated into, or associated with, the lower electrode of an array objective lens. That is in both embodiments the sensor units may be integrated into the objective lens 501. (The sensor unit 503 of the FIG. 7 may be mounted to, but not necessarily integrated with an electrode of an array objective lens furthest from the source, or closest to the sample.). FIG. 13 depicts a two electrode objective lens but it will be appreciated that any other form of objective lens, e.g. a three electrode lens, may also be used.

The electron detection device 240 in this example is placed away from the electrode of the objective lens 501 furthest from the source, in other words away from an upbeam electrode of the objective lens 501. In this position, an electrode in the objective lens 501 is closer to the sample, or down-beam, of the electron detection device 240. Thus the secondary electrons emitted by the sample 208 are accelerated by down beam positioned electrode array of the objective lens 501, for example to many kV (perhaps about 28.5 kV). The substrate supporting the sensor units 503 during operation may be held at the same potential (that is the difference in potential i.e. relative to a reference potential such as a source or a sample) as the upper electrode. As a result the sensor units 503 can comprise, for example, PIN detectors and/or scintillators. Scintillators and PIN detectors are typically capable of detecting charged particles above a detection threshold for example typically above approximately 1 kV, although lower values for example 200 eV for PIN detectors are known. For a scintillator the detection threshold may be varied by the selection of the thickness of a conductive coating, such as a metal layer, on the scintillator surface for example facing down beam such as towards the sample. Such a scintillator or PIN detector is insensitive to charged particles with an energy below the detection threshold. On emission secondary charged particles, such as secondary electrons, typically have a near zero energy of around 50V. Using the scintillator or PIN detector within the objective lens rather than down beam of the objective lens thus ensures that such low energy charged particles from the sample have sufficient energy for detection by the scintillator or PIN detector because of the acceleration of the charged particles by the down beam positioned electrode. Use of a PIN detector or a scintillator has the advantage that no significant additional noise sources are present as PIN detectors and scintillators have a large initial amplification of the signal. Another advantage of this arrangement is that it is easier to access the electron detection device 240, e.g. for making power and signal connections or for servicing in use. Sensor units having capture electrodes could be used at this location instead, but this could result in poorer performance.

A PIN detector comprises a reverse-biased PIN diode and has an intrinsic (very lightly doped) semiconductor region sandwiched between a p-doped and an n-doped region. Secondary electrons incident on the intrinsic semiconductor region generate electron-hole pairs and allow a current to flow, generating a detection signal.

A scintillator comprises a material that emits light when electrons are incident on it. A detection signal is generated by imaging the scintillator with a camera or other imaging device.

In order to correctly image secondary electrodes on the sensor units 503 it is desirable to provide a relatively large potential difference between last electrode and the sample 208. For example the upper electrode of the objective lens may be at about 30 kV, the lower electrode at about 3.5 kV and the sample 208 at about 2.5 kV. A large potential difference between the lower electrode and the sample 208 may increase aberrations of the objective lens on the primary beam but a suitable trade-off can be selected.

Exact dimensions of an embodiment may be determined on a case-by-case basis. The diameter of the beam apertures 504 may be in the range of about 5 to 20 μm, e.g. about 10 μm. The width of the slits in the electrodes may be in the range of from 50 to 200 μm, e.g. about 100 μm. The pitch of the beam apertures and the electrode slits may be in the range of from 100 to 200 μm, e.g. about 150 μm. The gap between upper and lower electrodes may be in the range of from about 1 and 1.5 mm, e.g. about 1.2 mm. The depth of the lower electrode may be in the range of from about 0.3 to 0.6 mm, e.g. about 0.48 mm. The working distance between the lower electrode and the sample 208 may be in the range of form about 0.2 to 0.5 mm, e.g. about 0.37 mm. Desirably the electric field strength between the lower electrode and the sample 208 is no more than about 2.7 kV/mm in order to avoid or reduce damage to the sample 208. The field in the gap between upper and lower electrodes can be larger, e.g. over 20 kV/mm.

The beam apertures 504 associated with the sensor units have smaller diameters than the electrode arrays to increase the surface of the sensor units available to capture electrodes emanating from the sample. However the dimensions of the beam aperture diameters are selected so that they permit passage of the sub-beams; that is the beam apertures are not beam limiting. The beam apertures are design to permit passage of the sub-beams without shaping their cross-section. The same comment applies to the beam apertures 406 associated with the sensor units 402 of the embodiment depicted in FIGS. 4 to 7.

In an embodiment, a single sensor unit (e.g. PIN detector) surrounds each aperture. The plurality of sensor units may be adjacent respective ones of the beam apertures and configured to capture charged particles emitted from the sample. The single sensor unit may have a circular perimeter and/or an outer diameter. The sensor unit may have an area extending between the aperture and the perimeter of the sensor unit. The sensor units 503 may be arranged in rectangular array or a hexagonal array.

In another embodiment, a sensor unit may have a plurality of sensor elements (e.g. smaller PIN detectors). The plurality of sensor elements for each sensor unit is provided around an aperture. The plurality of sensor elements may, together, have a circular perimeter and/or a diameter. The plurality of sensor elements may, together, have an area extending between the aperture and the perimeter of the plurality of sensor elements. The pluralities of sensor elements may be arranged in rectangular array or a hexagonal array. The signal generated from electrons captured by sensor elements surrounding one aperture may be combined into a single signal or used to generate independent signals. The sensor elements may be divided radially. The sensor elements may form a plurality of concentric annuluses or rings. The sensor elements may be divided, angularly. The sensor elements may to form a plurality of sector-like pieces or segments. The segments may be of similar angular size and/or similar area. The sensor elements may be divided both radially and angularly or in any other convenient manner. The surfaces of the sensor units, optionally their sensor elements, may substantially fill the surface of the substrate supporting the sensor units.

Figure 15A:
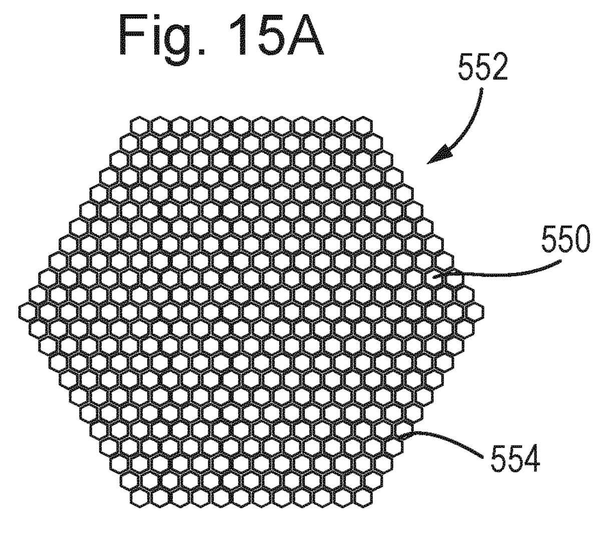
FIGS. 15A, B and C are is a schematic representation of a detector array (e.g. in a detector substrate) and an associated cell array according an embodiment, a schematic representation of a cell of the cell array, and a cell of the cell array according to an embodiment.

As shown in FIG. 15A a surface of a detector array (e.g. in a detector substrate) or detector module 402 facing, even proximate in use to, a sample features an array of sensor units. Each sensor unit is associated with an aperture. Typically the pitch of the apertures is between 10 and 500 micrometers, more preferably 50 to 300 micrometers, example 70 micrometers. Each sensor unit is associated with an assigned surface area of the substrate of the detector module 402. As the substrate is layered, for example in having a CMOS structure, each layer within the substrate is positioned with respect to the respective sensor unit, preferably proximately. Commercially available CMOS structures have a usual range of layers, for example three to ten, usually about five. (The details provided with respect to FIG. 7 are exemplary and two functional layers are provided for ease of description. These two layers of wiring layer and logic layer may represent as many layers as required and each layer is not restricted to wiring or logic, respectively.) The number of layers is limited by commercial availability and any number of layers is feasible. However, in view of practicality, the substrate has a limited number of layers, in order for an efficient design the available space is limited.

Ideally a circuit layer of the substrate, which can be the wiring layer and/or logic layer, has a portion assigned for each sensor unit. The assigned portions of the different layers may be referred to as a cell 550. The arrangement of portions in the substrate for the full multi-beam arrangement may be referred to as a cell array 552. The cells 550 may be same shape as the surface area assigned for each sensor unit, such as hexagonal, or any reasonable shape that may tesselate and may all be similar in shape and/or area, such as a rectangular shape as will be described with respect to FIG. 16. Having a rectangular or rectilinear shape can more readily be used by placing and routing design. Such design is commonly implemented by software that is suited to define chips with an rectangular type architecture with orthogonal directions, than architecture requiring acute or obtuse angles such as in a hexagonal architecture. In FIG. 15A the cells 550 are depicted as being hexagonal and the cell array 552 is depicted as a hexagon comprising individual cells. However, ideally each similarly located with respect to sensor unit. Wiring routes 554 may connect to each cell 550. The wiring routes 554 may be routed between other cells of the cell array 552. Note: reference to wiring routes to be between cells of the array, it is intended that at least the wiring routes avoid the beam apertures of the array of apertures, e.g. defined through the cell array. In an arrangement circuit architecture, the cell size in at least the circuit layer may be reduced to accommodate the wiring routes, so that the wiring routes are routed between cells. Additionally or alternatively the wiring routes pass through the cells of the cell array, preferably towards the perimeter of the cells for example to reduce the interference of the wiring routes with other circuitry in the cells. Therefore reference to a wiring route between the cells encompasses: a wiring route between the circuitry of cells, a wiring route within cells, preferably towards the periphery of the cells and at least around the beam apertures through the cells and any intermediate variation. In all these arrangements, for example in a CMOS architecture, the wiring routes may be in the same die as the other circuitry which may define circuitry in the same cell as a portion of the wiring route, or circuitry in a cell around which the wiring route is routed. Thus, the cells and wiring routes may be parts of a monolithic structure for example with the sensor units 402 of the detector array. The wiring routes 554 may signally connect the cells. Thus the wiring routes signally connect the cells 550 to a controller or data processor external to the cell array or even the substrate or detector module 402. The circuit layer may comprise a datapath layer for the transmission of sensor signals from a cell outward of the cell array.

The controller or data processor may before circuitry within the substrate or detector module 402, preferably external to the cell array for example as control and I/O circuitry (not shown). The control and I/O circuitry may be in the same die as the cell array; the control and I/O circuitry may be monolithically integrated with the cell array, for example in the same CMOS chip. The control and to I/O circuitry enables an efficient connection between the data from all the cells of the cell array 552. Consider for example an arrangement of 2791 cells each having an 8 bit digital output. Such an arrangement would have 22328 signals (i.e. 8 bit output*2791 cells) to the electronics located outside the CMOS chip. The standard way of doing this is to use a SERDES circuitry (serializer/de-serializer). Such circuitry would transform a large number of low data rate signals into a few number of high data rate signals by means of time division multiplexing. It is therefore beneficial to have control and I/O circuitry monolithically with the cell array, or at least in the detector module, than external to the detector module 402.

In embodiments the control and I/O circuitry may feature general supporting functions, such as circuitry to communicate with the electronics outside the CMOS chip to enable loading certain settings, for example for control of amplification and offset such as subtraction as described herein.

Figure 15B:
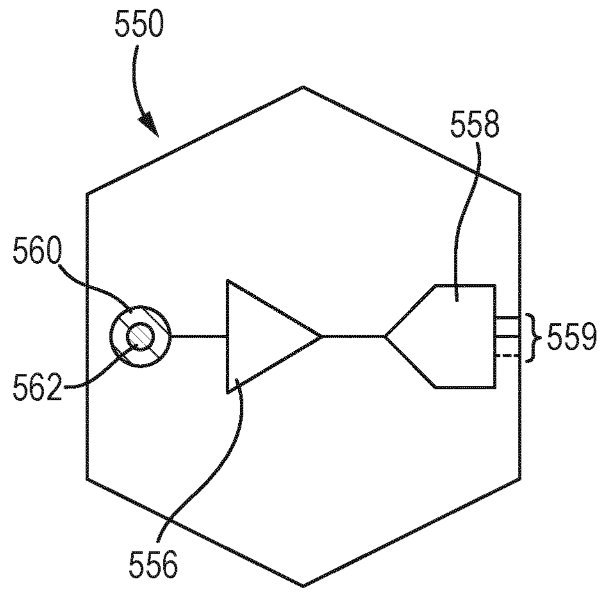

The circuit layer of a cell 550 is connected to the sensor unit 503 of the respective cell. The circuit layer comprises circuitry having amplification and/digitation functions, e.g. it may comprise a amplification circuit. A cell 550 may comprise a trans impedance amplifier (TIA) 556 and an analogue to digital converter (ADC) 558 as depicted in FIG. 15B. This figure schematically depicts a cell 550 with an associated sensor unit 503 such as capture electrode and a feedback resistor 562 connected to the transimpedance amplifier 556 and the analogue to digital converter 558. The digital signal lines 559 from the analogue to digital converter 558 leave the cell 550. Note that the sensor unit is represented as a detector element 560 and feedback resistor is shown associated with the detector area as a disc 562 rather than associated with the transimpedance amplifier 556. This schematic representation is to represent each of the detector element and the feedback resistor as an area to indicate their relative size, the reason for which will become apparent when referring to FIG. 15C.

Figure 16:
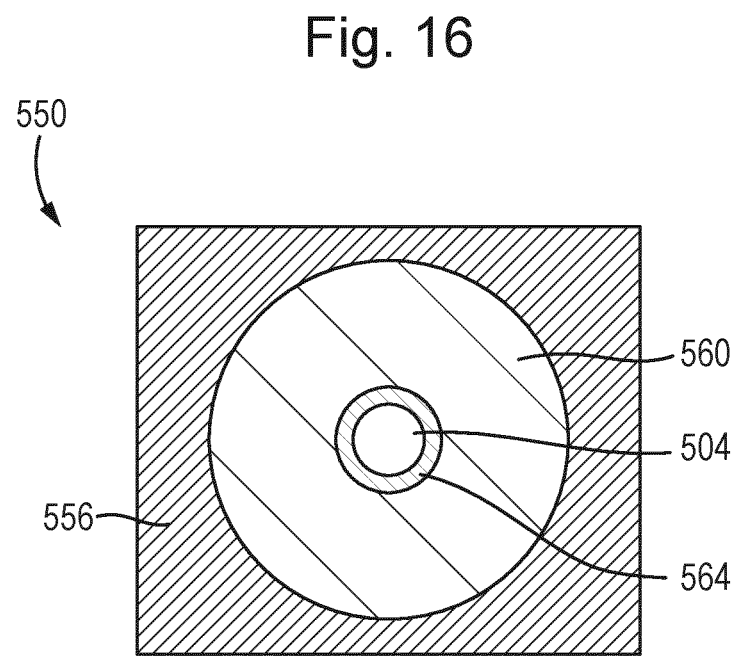

FIG. 16 shows a schematic representation of a cell 550 and an associated sensor unit 503. The sensor unit 503 is represented by detector element 560. Defined in the detector element is a beam aperture 504, 406. Between the beam aperture 504 and the detector element 560 is a barren region. The barren region extends through the substrate of the detector module 402, The barren region 564 of the cell is free from circuitry for example CMOS architecture. This barren region is too close to the sub-beam path of the multi-beam. Circuitry present in the barren region is likely to malfunction for example due to exposure to the field generated by a respective sub-beam. Additionally or alternatively, operation of the circuitry could disturb the electron beams. Typically all metal layers in the barren region 564, along the surface of the beam aperture 504 through the substrate 502 should be at a potential close to the substrate potential. Thus the surface of the beam aperture 504 through the substrate should be free of isolators which are present in the circuit layer. Therefore circuitry is desirably avoided if not absent in the barren region 564.

An outer region 566 of the cell, outward of the detector element with respect to the aperture, is depicted. The perimeter of the outer region may define an area that is equivalent to the hexagonal shape as depicted in FIGS. 15A and 15B. The hexagonal area may correspond to the closest portion of the substrate facing surface of the detector module 402. However, considering an example in which the pitch of the beam apertures is 70 micron, one side of the rectangle may be dimensioned to correspond to the beam pitch and the orthogonal side would then be dimensioned to 60 micron. In this way the perimeter of the outer region of each cell may tesselate and fill the cell array. This outer region 566 may correspond to a sample facing surface of the detector module 402, for example its constitute substrate. Such a portion of the sample facing surface of the detector module is uncovered by detector elements; however in an embodiment although a the outer region is shown to be a square or a rectangular, portions of the outer region could correspond to, and overlap with, the outer region of an adjoining cell 550.

In an arrangement the beam apertures may be at a pitch of 10 to 500, preferably 50 to 300 micrometers, for example 60 to 70 micrometers. The dimensions of the cell and thus the outer dimensions of the outer region may correspond to the pitch dimensions. For an exemplary beam pitch of around 70 micrometers, the dimension of the detector element may be a diameter of for example 30 to 70 micrometers, for example 50 micrometers. The dimension, for example an outer diameter i.e. of the ring or annulus, of the barren region may be 10 to 20 micrometers, for example 15 micrometers. The dimension in the plane of the detector element of the beam aperture 504 may be 5 to 15 micrometers, for example 5 micrometer. Therefore the width of the barren region, e.g. between its inner and outer diameters may be one to five (1 to 5) micrometers.

As described with reference to and shown in FIGS. 8 and 9, the transimpedance amplifier may comprise a feedback resistor Rf 562. The magnitude of the feedback resistor Rf should be optimized. The larger the value of this feedback resistor, the lower the input referred current noise. Thus the better signal-to noise ratio at the output of the transimpedance amplifier. However, the larger the resistance, Rf, the lower the bandwidth. A finite bandwidth results in a finite rise and fall time of the signal, resulting in additional image blur. An optimized Rf results in a good balance between noise level and additional image blur.

To implement the design the circuitry i.e. the amplification circuitry associated with each sensor unit should be within the layers of the associated cell 550 and fit in the limited area available of the portions of each associated layer. In the case of a beam pitch of 70 micron, the available area per layer in the cell is typically only 4000 square micron. Depending on the sensed signal particles, e.g. secondary and/or backscattered electrons, for example as current to be measured by the sensor unit, the optimum value for the feedback resistor Rf can be as high as 30 to 300 MOhm. If such a resistor would be implemented as a poly resistor in a standard CMOS process the size of such resistor would be much larger than the area that is available in the CMOS layers of the cell 550. For example, a resistor of 300 MOhm would consume around 500000 micron^2. This is about 130 times larger than the entire available area.

Typically, for example in CMOS architecture, such a large resistor would be made in a single layer for example of polysilicon. Usually there is a single layer of polysilicon. In some circumstances a layer could be provided having material capable of providing high resistor values, although with such a high aspect ratio (e.g. extreme length relative to width of the resistive structure in the layer) the reliability of the resistor remains. Even if the cell were to have multiple layers used for such a resistor, many more layers would have to be present that is readily available for example using CMOS technology. Additionally or alternatively, the meandering path through different layers would not mitigate the high aspect ratio and risk of variation in the resistance value would only be contributed by the interconnections between different layers. Such interconnects influence the variability of the resistance value of a resistor as a corner, as later described herein.

Note that such dimensions are calculated assuming a 180 nm node architecture and processing. If alternatively a smaller processing node is used, it is unlikely that a factor of thousand in reducing the dimensions of the resistor structure could be gained. Further, using 180 node architecture is preferred to a smaller node for processing reasons. For instance interconnects in a 180 nm node are simpler to process. Post processing of a detector chip for example in etching the beam apertures 504 uses aluminum interconnects. Such post processing at a sub-180 nm node typically uses a process with Copper interconnects. Processing at 180 nm is therefore simpler than at sub-180 nm.

Further if such a resistor were made, in whichever node, the reliability of the resistor specifications as well as the space available for the resistor may be challenging.

In a layered structure for chip architecture, such as CMOS, the components and features are defined as structures in a layer. The specification of a component is dependent on the material of the layer and the physical properties of the layer, the dimensions of the layer, specifically its thickness and the dimensions of the structure formed in the layer. A resistor may take the form of a long narrow path, route or wire. In view of space constraints, the path may be non-linear, having corners along its path. For such a long component, the width of the path in the layer may vary such as through manufacturing tolerances. A corner may provide greater variance than a linear section of the path, limiting the accuracy with which the resistor can be made in order to have a specified resistance. With many corners and a long length, a resistor having such topology may made with poor reliability so that the resistances for equivalent resistors in different cells of the cell array may have a large range.

Such a resistive structure has a large surface area. Additionally or alternatively, a resistor with such a large surface area would additionally have a capacitance which is undesirable; such a capacitance is referred to as a parasitic capacitance. Parasitic capacitances may undesirably contribute to noise and blur, influencing the balance between noise, blur and bandwidth optimization which is elsewhere herein described The material properties of the layer can be modified chemically; however such modifications are unlikely to achieve the improvement of several orders of magnitude in size to fit into available space in the cell. Such modifications are unlikely to change the topography of the feedback resistor sufficiently so that has the required specification and can be made with the desired reliable accuracy.

Such requirements in reliability and size would enable the resistor to achieve its desired performance in terms of bandwidth, signal to noise ratio, and stability. Unfortunately these requirements cannot be met.

Alternative amplification circuitry is proposed which does not require such a large feedback resistor. Examples in include a trans impedance amplifier with a pseudo resistor as a feedback element, see FIG. 17, and a direct analogue to digital converter, obviating the need for a transimpedance amplifier. Two examples of a direct analogue to digital converter are: using a low duty cycled switched resistor, FIG. 18, and using a reference capacitor, FIG. 19. An optional arrangement is to remove the analogue to digital converter 558 from the cells 550 so that a circuit wire 570 connects the trans impedance amplifier 556 in the cell 550 with the analogue to digital converter external to the cell array 552, FIG. 15C. The arrangement depicted in FIG. 15C may be applied to an amplifier circuit as depicted in FIGS. 8 and 9 or to the amplifier circuits shown in FIGS. 17, 18 and 19. Each option is now mentioned in turn. The example amplifier circuits described are just some of the suitable types of amplification circuitry that can be used. Other amplifier circuits may exist which achieve similar benefits to those described herein and which use similar circuit architecture for each cell as herein described.

Figure 17:
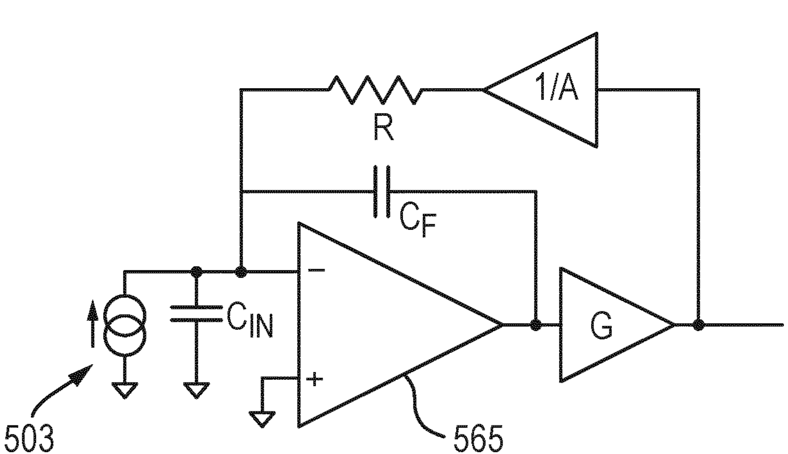
FIG. 17 is circuit diagram of an exemplary amplification circuit according to an embodiment.

The amplification circuit depicted in FIG. 17 is a trans impedance amplifier 565 with a pseudo resistor R as a feedback element that is connected to the output of a sensor unit 503. A pseudo resistor is a resistor formed by an arrangement of transistors rather than by a true resistor. A pseudo resistor can respond in a non-linear manner for example in having a different effective resistance in response to different applied potential differences. This feature can be beneficially applied in the amplification circuit to help provide a variable amplification function. However, there is a risk of signal distortion which can be limited by limiting the amplitude of the applied potential.

In order to limit the negative effect of non-linearity of such pseudo resistor an attenuator A is used in the feedback loop of the feedback element. The attenuator functions to regulate the swing in voltage fluctuations or amplitude. The attenuator has resistors. Individually these resistors in the attenuator are smaller than the feedback resistor Rf although there are more of them.

Thus the use of a pseudo resistor in the feedback loop of a trans impedance amplifier, reduces the effective size of the amplifier circuit. Because it is smaller and is an arrangement of transistors, the risk of variation between pseudo resistors in the amplifier circuitry of different cells reduces. The structure, performance and specification between different pseudo resistors is more consistent and reliable than the feedback resistor Rf as in the arrangement depicted in FIGS. 8 and 9.

The feedback element may additionally include: a capacitor CF, in parallel with the pseudo resistor R and attenuator A; and a gain amplifier between the parallel feedback loops of the capacitor and pseudo resistor. The relationships between these different elements including the effective resistance of the feedback element, for example in terms of the amplified output voltage $V_{out}$ and the input current from the sensor unit, $I_{in}$, is:

$$\frac{V_{out}}{I_{in}} \approx (R \times A)$$

The bandwidth fc of the depicted design of transimpedance amplifier in FIG. 17 is approximately:

$$f_c = \frac{1}{2\pi(R \times A)\left(\frac{C_F}{G}\right)}$$

Beneficially, use of such pseudo resistor additionally protects to damage due to ESD (electrostatic discharge). Further details on the use of pseudo resistors in a transimpedance amplifier is disclosure in: *D. Djekic, G. Fantner, K Lips, M Ortmanns and J. Anders, "A* 0.1% *THD,* 1-*MΩ to* 1-*GΩ Tunable, Temperature-Compensated Transimpedance Amplifier Using a Multi-Element Pseudo-Resistor," in IEEE Journal of Solid-State Circuits, vol.* 53, *no.* 7, *pp.* 1913-1923, *July* 2018, which is hereby incorporated by reference.

Amplifier circuitry featuring such a transimpedance amplifier may be used with a standard analogue to digital converter, as described in the following disclosures, all of which are hereby incorporated in their entirety:

*SAR ADC* (*e.g. "A Compact* 10-*b SAR ADC With Unit-Length Capacitors and a Passive FIR, JSSC* 2019.")

*Single-slope ADC* (*e.g. "J Wei, X Li, L. Sun and D. Li, "A* 63. 2 *μW* 11-*Bit Column Parallel Single-Slope ADC with Power Supply Noise Suppression for CMOS Image Sensors,"* 2020 *IEEE International Symposium on Circuits and Systems* (*ISCAS*), *Sevilla,* 2020, *pp.* 1-4.")

Figure 18:
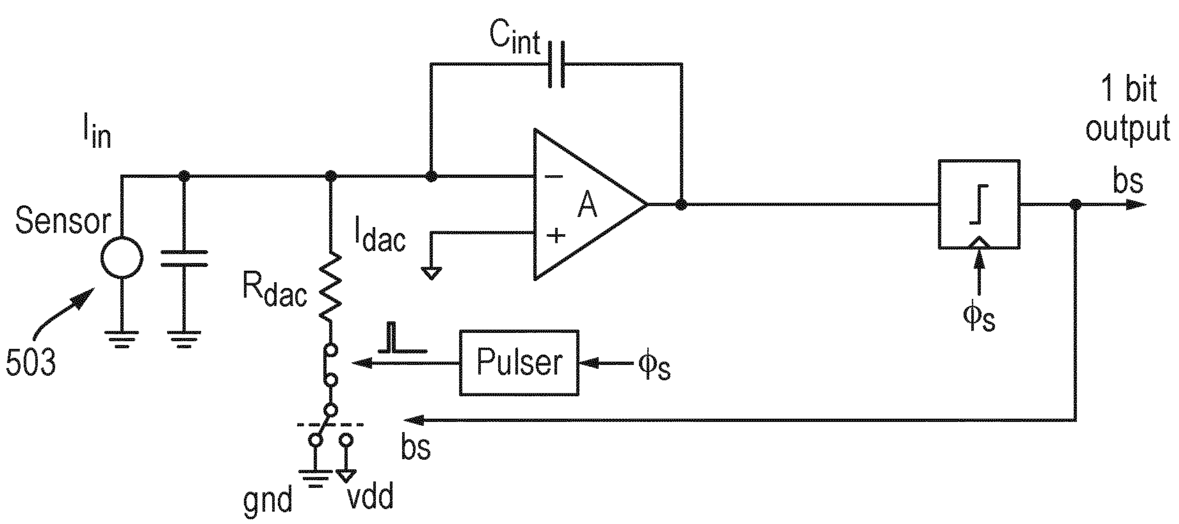
FIG. 18 is a circuit diagram of another exemplary amplification circuit according to an embodiment.
Figure 19:
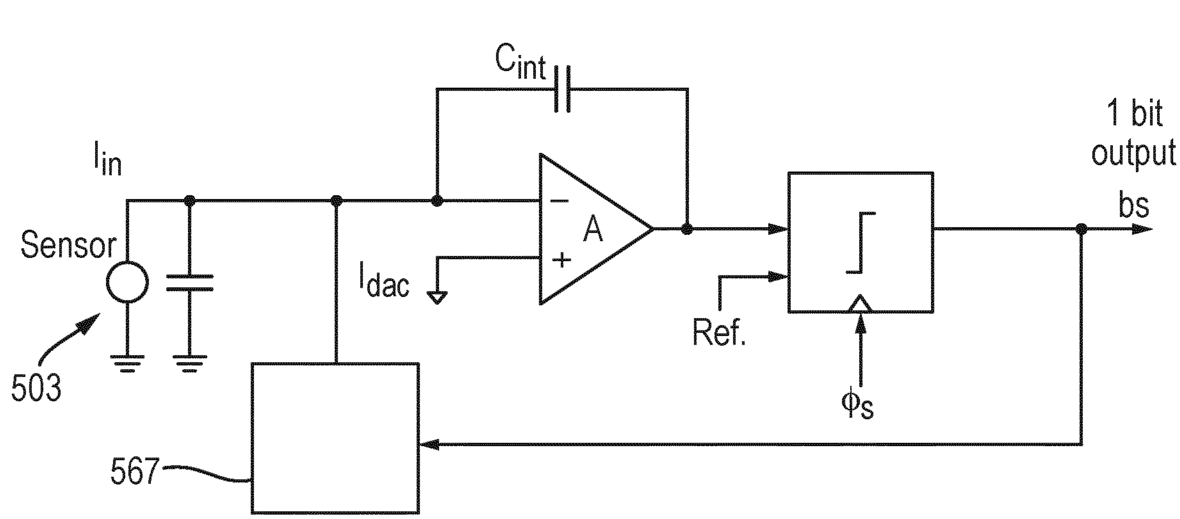
FIG. 19 is a circuit diagram of another exemplary amplification circuit according to an embodiment.

An alternative amplification circuit is a direct analogue to digital converter for example using a switched resistor or capacitor, as depicted in FIGS. 18 and 19 that are connected directly to the output of a sensor unit 503. A suitable type of direct analogue to digital converter is a charge-balancing direct current-to-digital converter. Using a direct analogue to digital to converter avoids using a trans impedance amplifier and having the feedback resistor Rf or an exotic alternative. Removing the transimpedance amplifier removes the most power consuming component in the amplification circuit and the main source of input noise. Delta/sigma modulators provide the best realization of charge-balancing direct current-to-digital converter. The two possible solutions are depicted in FIGS. 18 and 19 are: using as a reference a low duty cycle switched resistor; and using as a reference a switched capacitor. These circuits are exemplary and other suitable circuits may exist A suitable direct current-to-digital converter with low duty cycle switched resistor, is depicted in simplified form FIG. 18. The circuit has an integrator A to which is input the output from the sensor unit 503 and the reference resistor $R_{dac}$. A capacitor $C_{int}$ is in a feedback loop of the integrator A. The signal output from integrator A is processed by a comparator to for the final step of converting the analogue signal to a digital signal. A bit stream bs provides a feedback from the output of the comparator to a control switch for the reference current $I_{dac}$ using a charge balance loop. The design of control switch helps to ensure a long term stable balance between the sensor current $I_{in}$ and the reference current $I_{dac}$. This helps ensure that the integrator will not clip its output signal and output bit stream, bs, is a digitised version of the sensor current $I_{in}$ In using such direct current-to-digital converter with low duty cycle switched resistor a the size of a reference resistor $R_{dac}$ is reduced, for example in realizing it a CMOS circuit. This is achieved by connecting the reference resistor $R_{dac}$ to the input of the integrator A for a very small portion t of the clock period $T_{clock}$. This results in a small duty cycle: $t/T_{clock}$, e.g. 1:1000. This short connection time is sufficient to deliver the charge in reference current $I_{dac}$ required to balance the charge delivered in the current $I_{in}$ from the sensor unit, i.e. the sensor current. Providing a reference current in this way to balance the sensor current helps to ensure that the reference noise is small. Yet, using such a low duty cycle enables the same effect that would otherwise be achieved by a large resistor such as the feedback resistor Rf of a standard trans impedance amplifier. So this solution applies a smaller sized resistor than would otherwise be used and using the duty cycle to boost its effective size yet minimizing the actual size of the resistor and the effective are of the circuit layer in a cell required by this type of amplification circuit.

A suitable direct current-to-digital converter with a reference capacitor is depicted in simplified form in FIG. 19. The circuit has exactly the same features as the current-to-digital converter with low duty cycle switched resistor as depicted in FIG. 18, unless otherwise specified. A capacitive digital-to-analog converter 567 arranged in a switched configuration supplies the reference current. Such a switched capacitor digital-to-analog converter contains at least one capacitor and may contains a parallel capacitor network. Individual capacitors are connected or disconnected with switches based on the input. As a capacitor based circuit, the capacitive digital-to-analog converter 567 may be represented as reference capacitor $C_{dac}$ Instead of a reference resistor $R_{dac}$ a reference capacitor Cdac is used. Because a capacitor is used, selection of an appropriately sized capacitor will generate a suitable reference current $L_{dac}$, so that the a pulsar powered by a or clock signal $f_s$ to the reference circuit is not required. In restricting the use of the clock to the integrator, the effect of clock jitter is minimized. The effect of the reference current $I_{dac}$ on the sensor current is to quantize the signal of the sensor current. This is in effect direct digital conversion.

Figure 15C:
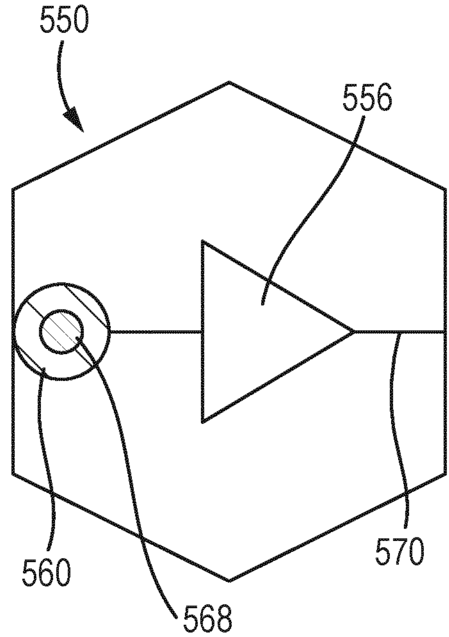

As depicted in FIG. 15C, a cell 550 comprises a transimpedance amplifier 556 connected to a detector element 560. Associated with this amplification circuitry is an effective feedback resistor 568. The output of the transimpedance amplifier is connected to an analogue to digital converter 558 (not shown) which is remote from the cell. A circuit wire 570 connects the trans impedance amplifier and the analogue to digital converter. The circuit wire 570 transmits an analogue signal. Considering that cell array 552 is densely packed, the analogue to digital to converter is external to the cell array for example one the same die as the cell array 552 and/or monolithically integrated with the cell array 552. In an embodiment the analogue to digital converter 558 is in the substrate of the detector module 402. Alternatively the analogue to digital converter is remote from the substrate, for example it is part of a processor external to the substrate.

The differences in components between the cells depicted in FIGS. 15B and 15C are that the cell of FIG. 15C only includes a trans impedance amplifier and not an analogue to digital convert and the circuit wire 270 transmits an analogue signal rather than the digital signal transmitted by the analogue to digital converter. By removing the analogue to digital converter from the cell 550, there is more space available in the circuit layer of the cell 550 for a feedback resistor element. This relative difference can be noted by the relative size of the feedback resistor areas 562 in FIGS. 15B and 15C; (but note, the relative dimensions do not necessarily apply to other features of these two figures). There is yet more space in the circuit layer of the cell 550 if the amplifier circuitry is uses an alternative trans impedance amplifier circuit to that depicted and described with respect to FIGS. 8 and 9, for example if a trans impedance amplifier with a pseudo resistor is used as a feedback element, as depicted in FIG. 17.

Although it may be easier to fit the trans impedance amplifier 556 with a pseudo resistor feedback element and analogue to digital converter in the circuit layers of the cell, in an arrangement it is more practical for space constraints for the analogue to digital converter 558 to be external to the cell array 552. This is despite the use of a pseudo resistor in the feedback element of the trans impedance amplifier providing a gain of one to two orders of magnitude in area. One consideration to decide whether or not the analogue to digital converter 558 is external to the cell array 552 is the beam pitch of the multi-beam. For example with a beam pitch of 70 micron, typically only 4000 square micron is available per layer of a cell for the circuitry including the amplification circuitry.

Under such space constraints, a trans impedance amplifier is located in the cell of each beam. The analogue to digital converter is located outside the array of beams, i.e. outside the cell array. In an embodiment, the analogue to digital converter is present on the same die as the cell array, for example monolithically with the cell array. Such an analogue to digital converter may be located with the control and I/O circuitry which may be on the detector module 402 or even monolithic with the cell array 552. Locating the analogue to digital converter external to the cell array may provide an area gain of about a factor of two.

The circuit wire 570 connects the trans impedance amplifier in a cell 550 with the associated analogue to digital converter 558. The circuit wire 570 transmits an analogue signal. Unlike a digital signal, a data path transmitting an analogue signal is susceptible to interference. Signal interference can be from cross-talk with other circuit wires and from external fields such as generated by the sub-beams of the multi-beam and fields from nearby electron optical components such as the objective lens array 241.

The circuit wire 570 is routed through the a wiring route 554 as depicted in FIG. 15A. The wiring route 554 is routed between cells so that the area of a cell and its layers is used for the amplification circuitry present on a cell. The wiring route 554 therefore only uses a portion of the circuit layers in which the wiring route is present, namely between adjoining cells 550 (e.g. at least around the beam apertures 504, 406 of the adjoining cells 550; through the adjoining cells 550 such as towards the periphery of the cells or between the circuitry in a layer assigned to the adjoining cells 550, or any arrangement between the stated arrangements). This routing avoids architectural interference of the amplification circuitry and the architecture of the wiring routes 554. Circuit wires are routed along the wiring routes in the cell array in an outward direction, for example in a radially outward direction. With greater proximity to a perimeter of the cell array 552, there may be more circuit wires 570 than in a portion of the wiring route 554 remote from the perimeter. The wiring route may have a plurality of circuit wires 570, which as described, is between cells of the array. Therefore a portion of the wiring route 554 may have more than one circuit wire 570. However, having circuit wires located close to each other risks crosstalk between the circuit wires and interference of the analogue signals transmitted by the circuit wires 570.

Figure 20:
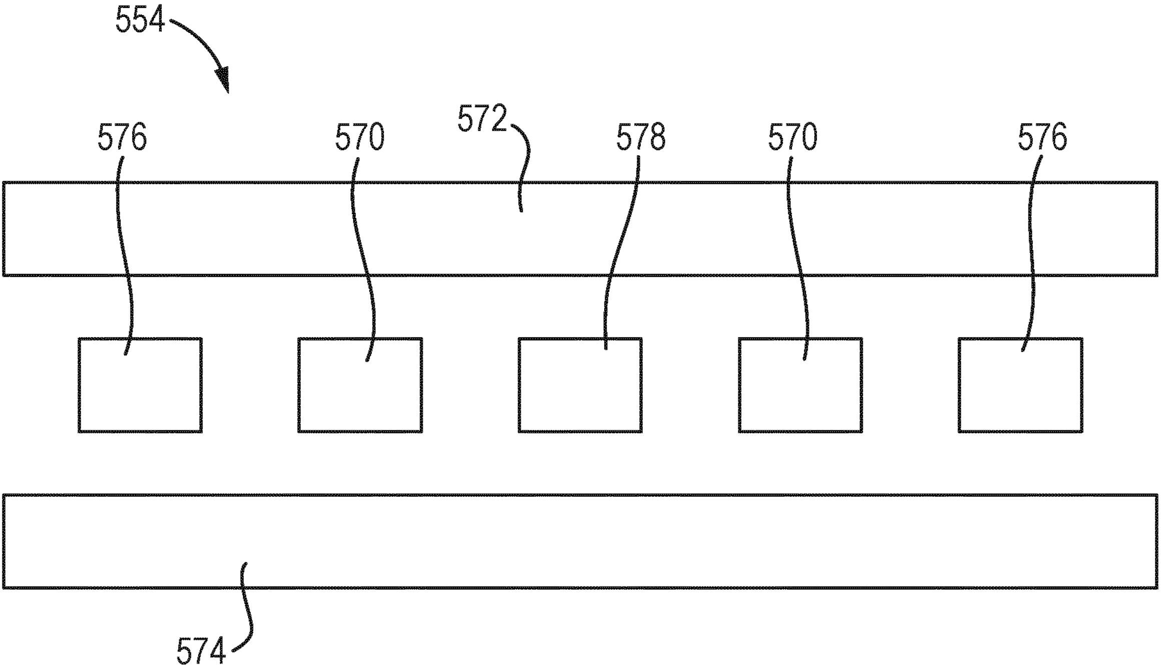
FIG. 20 is a schematic representation of a cross-section wiring route showing circuit wires and a shielding arrangement according to an embodiment.

The risk of crosstalk and signal interference may be at least reduced or even prevented by having the circuit wires 570 shielded from each other within the wiring route. FIG. 20 depicts cross-section of an exemplary arrangement of wiring route 554. Within the wiring route 554 are one or more circuit wires 470, shown extending in same direction as the wiring route 554 and a shielding arrangement. The circuit wires are shown in the same layer. Above the circuit wires 570 is an upper shielding layer 572; beneath the circuit wires 570 is a lower shielding layer 574. The upper and lower shielding layers of the shielding arrangement shield the circuit wires 570 from fields external to the wiring route 554 above and beneath the wiring route 554. The shielding arrangement has shielding elements in the same layer as the circuit wires 570. The shielding elements may be outer elements 576 at the outer edges of the layer comprising the circuit wires 570. The outer elements 576 shield the circuit wires 570 from fields external to the wiring route 554. The shielding elements may include intermediate shielding elements 578 that are present in the layer between adjoining circuit wires. The intermediate shielding elements 578 may therefore at least suppress if not prevent cross-talk between the circuit wires 570. In operation, a common potential is applied to the shielding layers 572, 574 and shielding elements 576, 578. The potential may be a reference potential for example a ground potential.

Although FIG. 20 depicts a three layer arrangement, as many layers may be used in the wiring route 570 as may be desired. For example, there may be two layers of circuit wires, requiring three shielding layers which include an upper shielding layer 572, a lower shielding layer 574 and an intermediate shielding layer. The intermediate shielding layer may additionally reduce if not prevent crosstalk between the circuit wires in the different layers of the wiring route 570. Thus, there are five layers in total. Every additional layer of circuit wires requires an additional intermediate shielding layer. Whereas increasing the number of layers in the wiring route 554 reduces the proportion of a layer that wire routing requires, such a variation in design requires additional layers. In view of the limited number of layers, there is an optimum number of layers at which the width of the wiring route is reduced without exceeding the number of layers required elsewhere in the substrate of the detector module, which can be limited to five layers.

A further consideration of the design of wiring route is the number of circuit wires that may need to be present in an exemplary design of detector module, for example consider the arrangement of FIG. 20 with all circuit wires 570 in a layer.

For example, an array of beams is arranged an hexagonal array with thirty (30) rings. The detector module therefore has a cell array of corresponding design. The number of cells is around 3000, for example 2791. Assuming such a cell array has a pitch of seventy (70) micron, the innermost cell is a ring of zeroth order, Ring #0, and has a single cell; the innermost ring, Ring #1, is around the central cell; and the outermost ring, Ring N, defines the perimeter of the cell array and consists of 6N cells. For a cell array of thirty rings, the total number of cells equals:

$$N_{cell} := 1 + \sum_{n=1}^{30} (6n) = 2.791 \times 10^3$$

The outermost ring has the highest number of signals that need to be routed through the ring. Considering the wiring route is routed between cells of the each cell, these signals are routed through the outermost ring between the cells of the outermost ring. Because the outermost ring consists of 180 cells (e.g. thirtieth ring multiplied by six, i.e. 30*6=6N), the number of signals transported through the outermost ring, e.g. between the cells of the outermost ring, is:

$$1 + \sum_{n=1}^{29} (6n) = 2.611 \times 10^3$$

The maximum number of signals to be routed through the outer ring between adjacent cells is the total number of signals (2611) divided by the number of cells in the outermost ring (180). This is fifteen 15 (rounded up to the nearest whole number). So that the signals are well shielded, for example to limit crosstalk and the influence of external fields, the wiring route has a shielding arrangement. In a single layer of wire circuits, the layer may have outer elements 576 at the edges of the wiring route and intermediate shielding elements 578 between adjacent circuit wires 570. With a wiring route of fifteen (15) circuit wires 570, there are sixteen shielding elements, including fourteen (14) intermediate shielding elements and two outer shielding elements 576. Therefore between adjacent cells 550 of the outer ring of the example, a wiring route having all circuit wires in the same layer would have thirty-one (31) elements of alternate shielding elements and circuit wires.

For cell array 552 for a beam array with a pitch of 70 microns, there is enough space, or area, available in the circuit layer, for such a wiring route 554. In a structure created using a process at the 180 nm node, the minimum half pitch of a metal layer is typically around 280 nm. In this context a half pitch is a line and a pitch is the line with an associated gap with an adjoining gap. The associated gap is typically the same width the line. The wiring route for thirty-one elements requires thirty-one pitches. However, the associated gap of one of the elements, that corresponds to the outer elements 576, is not part of the wiring route 554, but would separate the wiring route from adjoining circuitry. Therefore, for thirty one elements, sixty-one (61) half pitches are required, which corresponds to a width of the circuit wiring 554 of 17.1 micrometers.

In a different arrangement, the beam array may be hexagonal having 108 rings and around 35000 cells, and may be considered to be a monolithic beam array. The outermost ring has around 650 cells. Around 34350 signals are required to be routed through the outermost ring. So around 54 signals need to be routed through adjoining cells in the outermost ring. A wiring route 554 having 54 circuit wires 570 has 55 shielding elements. Applying a similar calculation as for the previous example in applying this architecture to a half pitch of 280 nm, the width of the circuit wire would be under 61 micrometers. This size would fit between the cells 550 of the outermost ring. In an alternative arrangement the beam arrangement is apportioned in to two or more strips with one or more intermediate strip for routing a support structure, cooling features such as conduits, data transmission lines and the like. Such a beam array may be referred to as a stripped beam array. The wiring routes may therefore be routed through the one or more intermediate strips. This enables a larger beam array, thus cell array yet maintaining a reasonably sized wiring route. If a stripped beam array were to have the same number of beams as a monolithic beam array, the wiring routes would have fewer circuit wires 570 than the monolithic cell array i.e. fewer than 54. Indeed a stripped beam array may achieve a larger number of sub-beams than a monolithic beam array because the size of the beam array, as limited by the maximum number of circuit wires that may be in the wiring route, would be larger The optimization of the noise performance for example in terms of bandwidth and noise optimization and balance between the blur and the noise can be enabled by making sure an amplification factor of the trans impedance amplifier is programmable. In a such an arrangement, the amplifier circuit of the cell, at least the trans impedance amplifier, is programmable. Such a programmable amplification circuit may comprise a variable amplifier and/or a variable analogue to digital converter for example. in terms of its sensitivity. The variable amplifier has a variable amplification range dependent on a detected beam current detected by a sensor unit 503. For example, when the detected beam current is low, or for a sample with a lower than typical secondary emission coefficient, the variable amplifier can be adjusted to provide a larger amplification than normally used. When a larger beam current than normal is detected by a sensor unit 503, or for a sample with a larger than typical secondary emission coefficient, the variable amplifier can be tuned to provide a smaller amplification.

This functionality is beneficial with a trans impedance amplifier with a feedback element having pseudo resistor. A pseudo resistor has different effective resistances on application of different applied voltages; unlike an ideal resistor which has a single resistance at all applied potential differences. In providing different resistance, the trans impedance amplifier associated with the pseudo resistor operates as a variable amplification. In providing an amplifier with variable functionality, an optimized balance between noise levels and image blur (referred to herein above as 'additional blur') may be achieved. Beneficially, the programmable amplification circuit may match the output of the trans impedance amplifier with the input of the analogue to digital converter. This may be as a programmable offset that is subtracted between the output of the trans impedance amplifier, and the input of the analogue to digital converter. The programmable offset may help reduce the required number of bits that need to be transmitted from the amplification circuit of a cell. The programmable offset may be implemented in the programmable amplifier. These measures help to ensure that the dynamic range of the trans impedance amplifier and the analogue to digital converter, and thus preferably the amplification circuit, are optimally used for different use cases. Such different use cases may include: the material properties of a sample under inspection, different assessment tool configurations for example using different beam currents. The range of applications may be enabled by the provision of a variable amplifier and a variable off set or threshold (e.g. subtraction by a programmable offset) desirable enables tuning of amplification, threshold and bandwidth As mentioned elsewhere herein, the circuitry associated with variable amplification and subtraction may be comprised in the control and I/O circuitry.

The present description relates to sensor units featuring capture electrodes and it may seem that it is such a sensor unity featuring capture electrodes that the present invention primarily relates. As described herein capture electrodes are current detectors. The signals generated by current detectors are analogue and are suspectable to interference from external fields and cross-talk.

Another type of sensor unit that can be used is a PIN diode, or another type of semiconductive detector, which measures the energy of a captured electron. The signal generated by a PIN diode may have a higher initial amplification than of a current detector; however the signal generated is analogue as for a capture electrode. Such a sensor unit may have associated circuitry for example as described in with reference to FIGS. 15A to 20. A signal generated by a PIN diode are suspectable to noise and interference from external influences, i.e. cross-talk. The impact of crosstalk greater with increased distance between the PIN diode and its associated circuitry. Such circuitry associated with PIN diode may feature an amplifier such as a trans-impedance amplifier or the like as described with respect to a sensor unit featuring a current detector such as a capture electrode or the like. It is desirable for such circuitry associated with a sensor unit to be associated with the respective cell of the cell array, for example as herein described, for example integrated within the same substrate as the PIN diode, for example in monolithic circuit architecture. The circuitry may be proximate to the PIN diode reducing and reducing the risk of interference and also of possible signal attention due to the path length between the detector in its associated cell within the detector array and the circuitry associated with the detector that is located away from the detector array.

The detector module 402 to which this description relates may be located in the electron-optical column proximate to a sample or the position of a sample on a sample support. In an embodiment, the sensor module is located further upbeam for example within an objective lens assembly or associated with an objective lens. Such arrangements are in the path of the sub-beams of the multi-beam. The detector module features an array of apertures for the paths of the sub-beams. In an arrangement the detector module may be positioned up beam of the objective lens and even up beam of electrodes of a lens associated with and up beam of the objective lens such as a control lens.

An electron beam tool 41 according to an embodiment has features that are the same as those described above having the same reference numerals. For conciseness, such features are not described in detail. For example such an electron beam tool 41 has a source 201, a condenser lenses 231 that generate sub-beams and focus the diverging sub-beams to an intermediate focus in a common plane, a macro collimator 270 preferably located at the common plane of intermediate foci, an objective lens array 241 and the sample 208. These features may each be as described with respect to the other electron beam tools described herein for example above.

Figure 21:
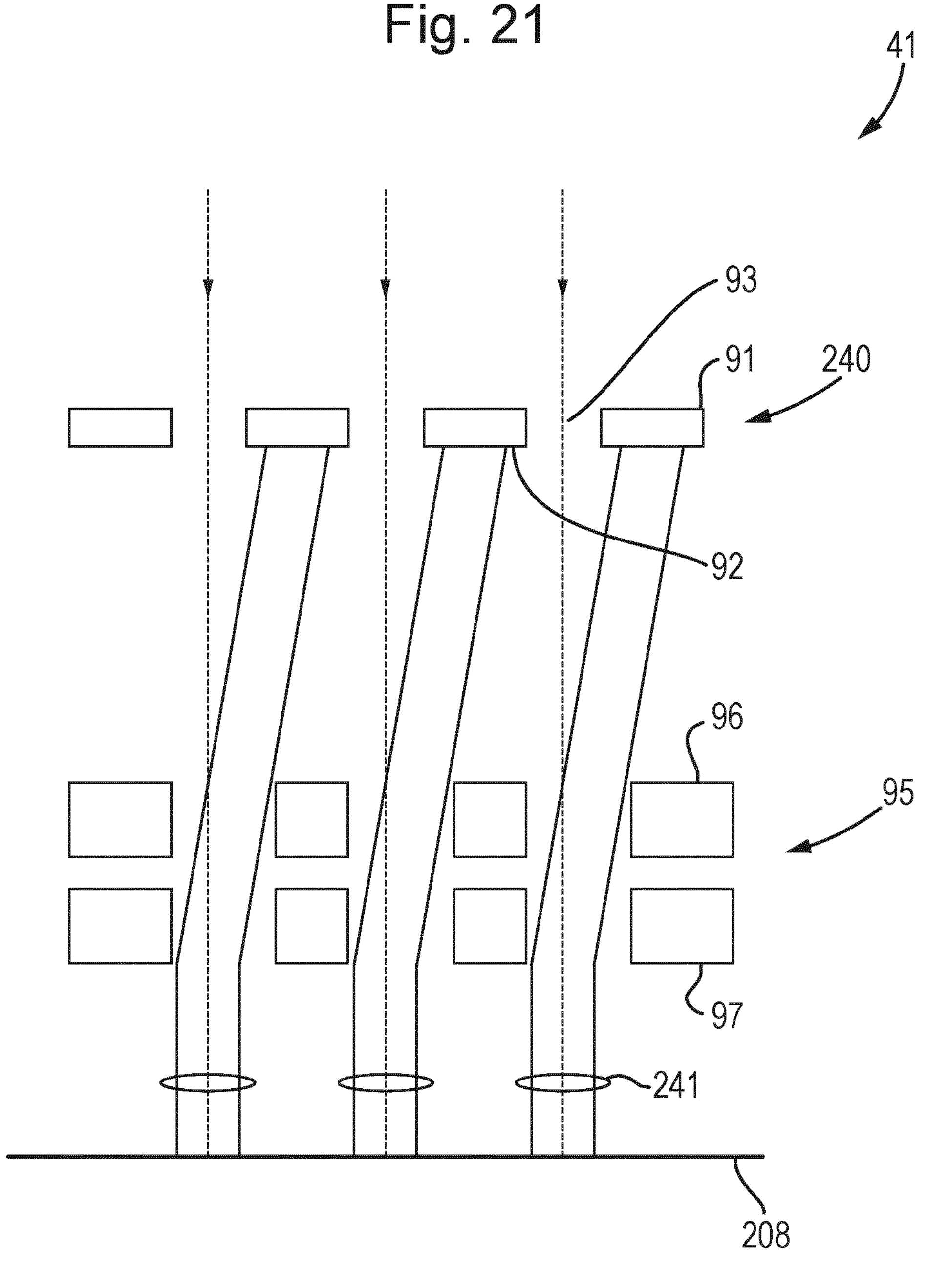
FIG. 21. is a schematic representation of part of another exemplary multi-beam apparatus according to an embodiment

As shown in FIG. 21, in an embodiment the objective lens array 241, which comprises the plurality of objective lenses, is between the detector array 240 and the sample 208. A deflector array 95 is between the detector array 240 and the objective lens array 241. In an embodiment the deflector array 95 comprises a Wien filter so that the deflector array may be referred to as a beam separator. The deflector array 95 is configured to provide a magnetic field to disentangle the charged particles projected to the sample 208 from the signal particles such as secondary electrons from the sample 208. The Wien filter may be in the form of an array, so that the Wien filter operates separately on one or more lines of beamlets across the multi-beam array. That is, in an embodiment the Wien filter may be a macro Wien filter with an aperture around the paths of all beamlets of the multi-beam array. In another arrangement, the Wien filter may be a Wien filter array. Such a Wien filter array has two or more apertures, each aperture surrounding one or more lines of paths of beamlets of the multi-beam array. In an arrangement the Wien filter may have an aperture surrounding each line of beams across the multi-beam array. Beneficially, having more than one line of paths of beamlets for an aperture of the enables the pitch of the multi-beam path in a across the arrays of the Wien filter array, for example in an orthogonal direction, to be smaller than the pitch of the apertures of the Wien filter array for example in a design of Wien filter array with one line of paths of beam per aperture.

In an embodiment the detector array 240 is configured to detect charged particles by reference to the energy of the charged particle, i.e. dependent on a band gap. Such a detector may be called an indirect current detector or an indirect detector. Such a detector may be a semiconductor based detector, such as a PIN detector. The signal particles emitted from the sample 208, such as secondary and/or backscatter electrons, gain energy from the fields between the electrodes. Secondary electrons have sufficient energy once they reach the detector array 240 to be detected. Alternatively the detector array may comprise current detectors as described herein for example as described with respect to and shown in FIGS. 4 to 9, 13 and 14.

The detector array may be a detector module 402 having the structure, arrangement, electrical and electronic circuitry shown in and described with reference to FIGS. 15A to 20. The substrate of the detector module may differ from that detector module described with reference to, and shown in, FIGS. 4 to 14 in that apertures are dimensioned to surround lines of paths of sub-beams across the multi-beam array. Such apertures may extend the lines of paths; such an aperture may be elongate. Such an aperture may be aligned with a direction. The detector portions are situated to one side of a corresponding aperture. This is instead of, for example, surrounding the aperture associated with each beam. The path of signal particles generated by impact of a sub-beam on a sample is up the primary sub-beam path and is diverted by the deflector array towards the corresponding detector element to the side of the corresponding aperture in the detector module.

In having a detector array with elements exclusively to detect signal particles as electrical signals, in place of a photonic detector elements such as a scintillator, the need for optical guides such as optical fibers. See for example the disclosure of optical fibers to guide light detector signals from a scintillator array to a photo detector remote from the path of the multi-beam towards the sample in US2019/0259564. Such optic fibers take up volume, add complexity and restrict the lower end of the range of beam pitch that is feasible in the multi-beam array. Having detector elements which generate an electrical detection signal may be desirable in enabling a smaller beam pitch within the multi-beam array. This may be more the case for adjacent beam paths in different lines of paths of the multi-beam array which are positioned to pass through different apertures of the Wien filter array. Such adjacent beam are restricted from having a pitch smaller than the pitch of the arrays in a direction across elongate apertures, for example orthogonal to the direction of the elongate apertures.

FIG. 21 is a close-up view of part of the electron beam tool 40. In an embodiment the detector array 240 comprises a signal detector array 91. The signal detector array 91 comprises a plurality of detector elements 92 that may be current detectors or indirect detectors. Each detector element 92 is located in the plane of the signal detector array 91. At least one detector element 92 is arranged between two adjacent apertures for the primary charged particle sub-beams projected towards the sample 208, preferably respectively two adjacent primary sub-beams.

In an embodiment, the detector elements 92 extend substantially in the horizontal direction. Alternatively, the signal detector array 91 may comprise a detector plate in which are defined openings 93 for the projected charged particle beams. In a further embodiment, an intermediate arrangement may be provided in which detector portions may be provided which provide detector elements for more than one sub-beam, optionally in which apertures may be defined The projected charged particle sub-beams, indicated by dashed lines in FIG. 21, are projected through the plane of the signal detector array 91, via the openings 93 between detector elements 92, towards the deflector array 95.

In an embodiment the deflector array 95, for example the Wien filter, comprises a magnetic deflector 96 and an electrostatic deflector 97. In each of the magnetic deflector 96 and the electrostatic deflector 97 are a plurality of apertures. Each aperture surrounds the paths of at least line of beamlet paths across the multi-beam array. The electrostatic deflector 97 is configured to counteract the deflection of the magnetic deflector 96 for the projected charged particle sub-beams transmitted towards the sample 208. Accordingly, the projected charged particle sub-beams may be shifted to a small extent in the horizontal plane. The sub-beams down-beam of the deflector array 95 are substantially parallel to the beams up-beam of the deflector array 95.

In an embodiment the objective lens array 241 comprises a plurality of plates for guiding secondary electrons created in the sample 208 towards the deflector array 95. For, The electrostatic deflector 97 does not counteract the deflection by the magnetic deflector 96 of the signal particles (e.g. secondary electrons), which travel in opposite direction with respect to the projected charged particle sub-beams. Instead, the deflections of the secondary electrons by the electrostatic deflector 97 and by the magnetic deflector 96 add up. Accordingly, the secondary electrons are deflected to travel at an angle with respect to the optical axis in order to transmit the secondary electrons onto the detector elements 92 of the detector array 240. The electrostatic and magnetic deflector arrays therefore function as a Wien filter so that a beam path of charged particles is substantially undisturbed in one direction, usually the primary direction, and deflected away from the electron-optical axis in the other direction, away from the sample. The deflected signal particles may be detected by the detector array, i.e. the detector elements.

In an embodiment, the substrate of the detector module 402, comprising the signal detector array 91, has layers such as circuit layer and a wiring layer. Alternatively the detector module 402 comprises a substrate comprising the signal detector array 91 and another substrate comprising layers that are joined together. Layers in the substrate comprising layers include a circuit layer and a wiring layer and apertures for example for the passage of the primary sub-beams. Thus the detector cells in one substrate are connected with associated circuitry and wiring in the other substrate. The layers in the substrate (with or without the features of the signal detector array 91) may have the structure, architecture and function as described with reference and depicted in FIGS. 15A to 20. Such functions may include providing, for example: amplifying the detection signal (e.g. using a Trans Impedance Amplifier), conversion of the detection signal from an analogue to a digital signal, and transmitting the signal from the respective cell in the detector array to externally of the detector array whilst minimizing, if not preventing, cross-talk with detection signals from other detectors.

In another arrangement, the detector array is located up-beam along the primary beam path of an objective lens array without a deflector array 95 between the objective lens array 241 and the detector array 240. In such an arrangement, the indirect detector elements may surround the apertures in the detector module 402 corresponding to the respective sub-beam of the multi-beam array. The architecture of the detector array and its detector elements may take the form of the embodiments described with reference to and depicted in FIGS. 4 to 7, 13 and 14.

In another embodiment, the detector module may be positioned at the end of a secondary projection apparatus 250, for example a second electron-optical column as depicted and described with respect to FIG. 2. As such a detector module 402 is at the end of the path of the signal particles, e.g. secondary and/or backscatter electrons, the detector module features planar sensor units. The sensor units do not feature a beam aperture, permitting more of the surface of the sensor unit to capture electrons.

The invention herein described can be applied to various different tool architectures. For example, the electron beam tool 40 may be a single beam tool, or may comprise a plurality of single beam columns or may comprise a plurality of columns of multi-beams. The columns may comprise the charged particle optical device described in any of the above embodiments or aspects. As a plurality of columns (or a multi-column tool), the devices may be arranged in an array which may number two to one hundred columns or more. The charged particle device may take the form of an embodiment as described with respect to and depicted in FIG. 11 or as described with respect to and depicted in FIG. 12, although preferably having an electrostatic scan deflector array and an electrostatic collimator array. The charged particle optical device may be a charged particle optical column. A charged particle column may optionally comprise a source An assessment tool according to an embodiment of the invention may be a tool which makes a qualitative assessment of a sample (e.g. pass/fail), one which makes a quantitative measurement (e.g. the size of a feature) of a sample or which generates an image of map of a sample. Examples of assessment tools are inspections tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron beam apparatus 40 may be a component of an assessment system; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

The following are exemplary embodiments of the invention; provided as clauses:

Clause 1. A detector substrate (or detector array) for use in a charged particle multi-beam assessment tool to detect charged particles from a sample, the detector substrate defining an array of apertures for the beam paths of respective charged particle beams of a multi-beam, the detector substrate comprising: a sensor unit array, a sensor unit of the sensor unit array adjacent a corresponding aperture of the aperture array and the sensor unit configured to capture charged particles from the sample, wherein the detector array (or detector substrate) comprises an amplification circuit associated with each sensor unit in the sensor unit array and proximate to the corresponding aperture in the aperture array, the amplification circuit comprising a Trans Impedance Amplifier and/or an analogue to digital converter.

Clause 2. The detector substrate of clause 1, comprising a cell array of cells, wherein the cell array comprises circuitry associated with the sensor unit array, the cells correspond to the apertures of the aperture array defined in the detector substrate, Clause 3. The detector substrate of clause 2, wherein the amplification circuit associated with each sensor unit is comprised with an associated cell of the cell array.

Clause 4. The detector substrate of clause 2 or 3, further comprising at least one circuit wire, wherein each circuit wire is associated with an associated cell of the cell array, the circuit wire connecting to the circuitry of the associated cell so as to signally connect the cell for signal communication external to the cell and preferably to a controller remote from the detector substrate.

Clause 5. The detector substrate of clause 4, wherein the at least one circuit wire is routed in a datapath layer of the substrate.

Clause 6. The detector substrate of clause 5, wherein the datapath layer comprises a circuit routing comprising the at least one circuit wire, the wiring route routed between the other cells of the cell array, preferably in a direction towards the perimeter of the cell array and/or arranged in a radial direction.

Clause 7. The detector substrate of clause 6, wherein the substrate comprises shielding elements configured to shield the wiring route.

Clause 8. The detector substrate of clause 7, wherein the shielding elements comprise: a grounding layer within the substrate above and/or beneath of the datapath layer; and/or a shielding element in the datapath layer either side of the wiring route and/or between circuit wires in the wiring route.

Clause 9. The detector substrate of any of clauses 4 to 8, wherein the or each circuit wire transceives data between the Trans Impedance Amplifier in the associated cell of the cell array and the analogue to digital converter remote from the cell array preferably in the substrate.

Clause 10. The detector substrate of any of clauses 2 to 9, wherein the substrate comprises CMOS circuitry comprising amplifier circuitry and the cell array, the CMOS circuitry preferably comprising multiple layers.

Clause 11. The detector substrate of any of clauses 2 to 8, wherein the Trans Impedance Amplifier is located in the associated cell and the analogue to digital converter is remote, preferably remote from the cell array.

Clause 12. The detector substrate of any of clauses 2 to 11, wherein the cell array is a hexagonal array or a rectangular array.

Clause 13. The detector substrate of any preceding clause, wherein the Trans Impedance Amplifier comprises a pseudo resistor, wherein the pseudo resistor preferably comprises a plurality of transistors Clause 14. The detector substrate of clause 13, wherein the Trans Impedance Amplifier further comprises an attenuator.

Clause 15. The detector substrate of any preceding clause, wherein the amplification circuit comprises the analogue to digital converter that is a direct digital converter, directly electrically connected to the corresponding sensor unit.

Clause 16. The detector substrate of clause 15, wherein the amplification circuit comprises a comparator, an integrator and reference.

Clause 17. The detector substrate of clause 16, wherein the reference comprises a low duty cycle switched resistor or a switched capacitor.

Clause 18. A detector substrate for use in in a charged particle multi-beam assessment tool to detect charged particles from a sample, the detector substrate defining an array of apertures for the beams path of respective charged particle beams of a multi-beam, the detector substrate comprising: a sensor unit of a sensor unit array configured to capture charged particles from the sample, a cell array, the cells of the cell array associated with an aperture of an aperture array for the path of the multibeam and associated with a sensor unit of the sensor unit array; and a wiring route configured to transmit signals from the associated sensor unit between the associated cell to at least a perimeter of the cell array, the wiring route configured to be routed between other cells of the cell array.

Clause 19. The detector substrate of clause 18, wherein the wiring route comprises at least one circuit wire between an associated cell and the perimeter of the cell array.

Clause 20. The detector substrate of clause 19, wherein the wiring route comprises more circuit wires closer to the perimeter.

Clause 21. The detector substrate of clause 19 or 20, wherein the wiring route extends in a radial direction.

Clause 22. The detector substrate of any of clauses 19 to 21, wherein the substrate comprises a shielding arrangement configured to shield the wiring route.

Clause 23. The detector substrate of clause 22, wherein the shielding arrangement comprises: a grounding layer within the substrate above and/or beneath of the wiring route; and/or a shielding element in the datapath layer either side of the wiring route and/or between circuit wires of the wiring route.

Clause 24. The detector substrate of any of clauses 19 to 23, wherein each circuit wire transmits data between a Trans Impedance Amplifier in the associated cell and an associated analogue to digital converter remote from the cell array preferably in the substrate.

Clause 25. The detector substrate of any of clauses 18 to 24, wherein the substrate comprises CMOS circuitry comprising amplifier circuitry and the cell array, the CMOS circuitry preferably comprising multiple layers.

Clause 26. A detector substrate for use in a charged particle multi-beam assessment tool to detect charged particles from a sample, the detector substrate defining an aperture array for respective beam paths of a multibeam, the detector substrate comprising: a sensor unit of a sensor unit array configured to capture charged particles from the sample; —a cell array, the cells of the cell array each associated with an aperture of the aperture array, and amplification circuitry associated which each cell of the cell array, the amplification circuitry comprising a variable amplifier and an analogue to digital converter.

Clause 27. The detector substrate of clause 26, wherein the variable amplifier is configured to have a variable amplification range dependent on a detected beam current detected by the sensor unit array.

Clause 28. The detector substrate of clause 27, wherein the variable amplifier comprises a pseudo resistor configured to provide different resistances at different applied voltage settings.

Clause 29. The detector substrate ofany of clauses 26 to 28, wherein the variable amplifier is configured to subtract an offset for input into the ADC.

Clause 30. The detector substrate of any of clauses 26 to 29, wherein the variable amplifier is programmable Clause 31. The detector substrate of any of clauses 26 to 30, wherein the variable amplifier associated with each cell is comprised in the corresponding cell.

Clause 32. The detector substrate of any of clauses 26 to 31, wherein the analogue to digital converter associated with each cell is comprised in the corresponding cell.

Clause 33. A detector substrate for use in a charged particle multi-beam assessment tool to detect charged particles returning from a sample, the detector substrate comprising a sensor unit array, a sensor unit of the sensor unit array configured to capture charged particles returning from the sample in response to a sub-beam of the multi-beam, wherein the detector array (or detector substrate) comprises a circuitry comprising a Trans Impedance Amplifier and/or an analogue to digital converter associated with each sensor unit in the sensor unit array.

Clause 34. A detector substrate in which is defined an array of apertures for beam paths of a charged particle multi-beam in a charged particle assessment tool, the detector substrate comprising: a sensor unit array, a sensor unit of the sensor unit array adjacent a corresponding aperture of the aperture array, the sensor unit configured to capture charged particles emitted from the sample; and—a cell array, the cells of the cell array corresponding to an associated sensor unit in the sensor unit array, a data path configured to transceive (e.g. transmit) data to and from a corresponding sensor unit of the sensor unit array, the datapath configured to be routed through other cells of the cell array.

Clause 35. A detector substrate for use in in a charged particle multi-beam assessment tool to detect charged particles from a sample, the detector substrate defining an array of apertures for the beams path of respective charged particle beams of a multi-beam, the detector substrate comprising: a sensor unit of a sensor unit array configured to capture charged particles from the sample, a cell array, the cells of the cell array associated with an aperture of an aperture array for the path of the multibeam and associated with a sensor unit of the sensor unit array; and a wiring route configured to transmit signals from the associated sensor unit between the associated cell to at least a perimeter of the cell array, the wiring route configured to be routed between the apertures of the cell array and/or of the array of apertures.

Clause 36: A detector substrate of any preceding clause wherein each sensor unit comprises at least one of: a capture electrode, a scintillator and a PIN diode.

Clause 37. An objective lens assembly for a multi-beam assessment tool, the objective lens assembly comprising: an objective lens configured to project a plurality of charged particle beams onto a sample, wherein in the objective lens is defined an array of beam apertures for a path of a respective charged particle beams towards the sample; and a detector substrate of any preceding clause.

Clause 38. A charged particle assessment tool comprising: the objective lens of clause 37

Clause 39. A charged particle assessment tool comprising: a detector substrate of any of clauses 1 to 34 and an objective lens array, wherein the detector substrate is up beam of the objective lens array Clause 40: A particle assessment tool of clause 39 further comprising a deflector between the detector substrate and the objective lens array, preferably wherein the apertures are elongate so as to extend across the detector array, each aperture surrounding at least one line of sub-beam paths across the multi-beam and preferably detector elements associated with respective sub-beams of the multi-beam are positioned adjoining a side of a corresponding elongate aperture.

Clause 41. A method assessing a sample using a multi-beam of charged particles using the detector substrate of any of clauses 1 to 36, the objective lens assembly of clause 37 or the charged particle assessment tool of any of clauses 38 to 40

Clause 42. A method of assessing a sample comprising: —projecting a multi-beam of charged particles towards a sample; —capturing charged particles emitted from the sample in response to the multi-beam of charged particles; —transmitting an analogue signal in response to the capture of a charged particle; —amplifying the analogue signal using an amplifier; —converting the analogue signal into a digital signal using an analogue to digital converter; and; —controlling the dynamic range of the amplifier and the analogue to digital to converter Clause 43. The method of clause 42, wherein the controlling of the dynamic range of the amplifier and the analogue to digital converter comprises controlling the amplification of the amplifier Clause 44. The method of clause 43, wherein controlling the amplification of the amplifier is dependent on a number of parameters Clause 45. The method of clause 44, wherein the number of parameters comprises at least one of: size of the beam current, and a second emission coefficient of the sample.

Clause 46. The method of any of clauses 42 to 45, wherein the controlling of the dynamic range comprises subtracting an offset between the output between the amplifier and the input of the analogue to digital converter.

Clause 47. The method of any of clauses 42 to 46, wherein the controlling of the dynamic range is controlled by a programable amplifier and/or a programable offset The descriptions above are intended to be illustrative, not limiting. Thus, it will be apparent to one skilled in the art that modifications may be made as described without departing from the scope of the claims set out below.

The invention claimed is:

1. A detector substrate for use in a charged particle multi-beam assessment tool to detect charged particles from a sample, the detector substrate defining an array of apertures for beam paths of respective charged particle beams of a multi-beam, the detector substrate comprising:

a sensor unit array, a sensor unit of the sensor unit array adjacent a corresponding aperture of the aperture array and the sensor unit configured to capture charged particles from the sample; and a plurality of amplification circuits, a respective amplification circuit from the plurality of amplification circuits associated with each sensor unit in the sensor unit array and proximate to the corresponding aperture in the aperture array, each amplification circuit of the plurality of amplification circuits comprising a Trans Impedance Amplifier and/or an analogue to digital converter.

2. The detector substrate of claim 1, further comprising a cell array of cells, wherein the cell array comprises circuitry associated with the sensor unit array, the cells correspond to the apertures of the aperture array defined in the detector substrate.

3. The detector substrate of claim 2, wherein the amplification circuit, associated with each sensor unit, comprises an associated cell of the cell array.

4. The detector substrate of claim 2, further comprising at least one circuit wire, wherein each circuit wire is associated with an associated cell of the cell array, and each circuit wire connecting to the circuitry of the associated cell so as to signally connect the cell for signal communication external to the cell.

5. The detector substrate of claim 4, wherein the at least one circuit wire is routed in a datapath layer of the substrate.

6. The detector substrate of claim 5, wherein the datapath layer comprises a circuit routing comprising the at least one circuit wire, the wiring route routed between the other cells of the cell array.

7. The detector substrate of claim 6, wherein the substrate comprises shielding elements configured to shield the wiring route.

8. The detector substrate of claim 7, wherein the shielding elements comprise:

a grounding layer within the substrate above and/or beneath the datapath layer; and/or a shielding element in the datapath layer either side of the wiring route and/or between circuit wires in the wiring route.

9. The detector substrate of claim 4, wherein the or each circuit wire transceives data between a Trans Impedance Amplifier in the associated cell of the cell array and an analogue to digital converter remote from the cell array.

10. The detector substrate of claim 2, wherein the substrate comprises CMOS circuitry comprising amplifier circuitry and the cell array.

11. The detector substrate of claim 2, wherein a Trans Impedance Amplifier is located in the associated cell and an analogue to digital converter is remote.

12. The detector substrate of claim 2, wherein the cell array is a hexagonal or rectangular array.

13. The detector substrate of claim 1, wherein the amplification circuit comprises the Trans Impedance Amplifier and the Trans Impedance Amplifier comprises a pseudo resistor.

14. The detector substrate of claim 1, wherein the amplification circuit comprises the analogue to digital converter and the analogue to digital converter is a direct digital converter, directly electrically connected to the corresponding sensor unit.

15. The detector substrate of claim 14, wherein the amplification circuit comprises a comparator, an integrator and reference.

16. A detector substrate for use in in a charged particle multi-beam assessment tool to detect charged particles from a sample, the detector substrate defining an array of apertures for beam paths of respective charged particle beams of a multi-beam, the detector substrate comprising:

a sensor unit array of a plurality of separate sensor units, each sensor unit having an electrode configured to have incident thereon charged particles from the sample, which incident charged particles induce current flow in the electrode;

a cell array of a plurality of cells, each cell of the cell array associated with a respective different aperture of an aperture array for the path of the multibeam and associated with a respective different sensor unit of the sensor unit array; and a wiring route configured to transmit signals from an associated sensor unit between the associated cell to at least a perimeter of the cell array, the wiring route configured to be routed between other cells of the cell array.

17. The detector substrate of claim 16, wherein the wiring route comprises at least one circuit wire between an associated cell and the perimeter of the cell array.

18. A detector substrate for use in a charged particle multi-beam assessment tool to detect charged particles from a sample, the detector substrate defining an aperture array for respective beam paths of a multibeam, the detector substrate comprising:

a sensor unit of a sensor unit array configured to capture charged particles from the sample;

a cell array, a cell of the cell array each associated with an aperture of the aperture array, and a plurality of amplification circuitries, a respective amplification circuitry from the plurality of amplification circuitries associated with each cell of the cell array, each amplification circuitry of the plurality of the amplification circuitries comprising a variable amplifier and an analogue to digital converter.

19. The detector substrate of claim 18, wherein the variable amplifier is configured to have a variable amplification range dependent on a detected beam current detected by the sensor unit array.

20. The detector substrate of claim 18, wherein the variable amplifier is configured to subtract an offset for input into the analogue to digital converter.

* * * * *